United States Patent
Morimoto et al.

(10) Patent No.: US 10,134,869 B2
(45) Date of Patent: Nov. 20, 2018

(54) METHOD OF MANUFACTURING SEMICONDUCTOR DEVICE

(71) Applicant: Renesas Electronics Corporation, Koutou-ku, Tokyo (JP)

(72) Inventors: Yasufumi Morimoto, Ibaraki (JP); Kiyonobu Takahashi, Ibaraki (JP); Morihiko Kume, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 162 days.

(21) Appl. No.: 15/368,625

(22) Filed: Dec. 4, 2016

(65) Prior Publication Data

US 2017/0186850 A1    Jun. 29, 2017

(30) Foreign Application Priority Data

Dec. 28, 2015    (JP) ................. 2015-256354

(51) Int. Cl.

| | |
|---|---|
| H01L 29/66 | (2006.01) |
| H01L 21/822 | (2006.01) |
| H01L 49/02 | (2006.01) |
| H01L 21/02 | (2006.01) |
| H01L 21/285 | (2006.01) |
| H01L 21/265 | (2006.01) |
| H01L 21/311 | (2006.01) |
| H01L 21/324 | (2006.01) |
| H01L 27/06 | (2006.01) |

(52) U.S. Cl.
CPC ........ *H01L 29/665* (2013.01); *H01L 21/0206* (2013.01); *H01L 21/265* (2013.01); *H01L 21/28518* (2013.01); *H01L 21/31111* (2013.01); *H01L 21/31144* (2013.01); *H01L 21/324* (2013.01); *H01L 21/822* (2013.01); *H01L 27/0629* (2013.01); *H01L 28/20* (2013.01); *H01L 29/6659* (2013.01); *H01L 29/66553* (2013.01)

(58) Field of Classification Search
None
See application file for complete search history.

(56) References Cited

U.S. PATENT DOCUMENTS 6,281,071 B1 * 8/2001 Murata ................ H01L 27/105
257/E27.081
8,115,154 B2    2/2012 Matsumoto et al.
(Continued)

FOREIGN PATENT DOCUMENTS

| JP | 2007-013006 A | 1/2007 |
|---|---|---|
| JP | 2010-056516 A | 3/2010 |

*Primary Examiner* — Angel Roman
(74) *Attorney, Agent, or Firm* — Shapiro, Gabor and Rosenberger, PLLC

(57) ABSTRACT

To provide a semiconductor device having improved reliability. After formation of an n+ type semiconductor region for source/drain, a first insulating film is formed on a semiconductor substrate so as to cover a gate electrode and a sidewall spacer. After heat treatment, a second insulating film is formed on the first insulating film and a resist pattern is formed on the second insulating film. Then, these insulating films are etched with the resist pattern as an etching mask. The resist pattern is removed, followed by wet washing treatment. A metal silicide layer is then formed by the salicide process.

19 Claims, 23 Drawing Sheets

(56) References Cited

U.S. PATENT DOCUMENTS

2002/0142540 A1* 10/2002 Katayama ........... H01L 27/0629
                                                              438/239
2013/0285131 A1* 10/2013 Matsumoto ....... H01L 27/14609
                                                              257/291

* cited by examiner

METHOD OF MANUFACTURING SEMICONDUCTOR DEVICE

CROSS-REFERENCE TO RELATED APPLICATIONS

The disclosure of Japanese Patent Application No. 2015-256354 filed on Dec. 28, 2015 including the specification, drawings, and abstract is incorporated herein by reference in its entirety.

BACKGROUND

The present invention relates to a method of manufacturing a semiconductor device, for example, a technology effective when applied to a technology of manufacturing a semiconductor device equipped with a semiconductor element having a metal silicide layer.

As semiconductor devices become highly integrated, field effect transistors (MISFETs: metal insulator semiconductor field effect transistors) are miniaturized based on the scaling rule. Even if field effect transistors are miniaturized, an increase in the resistance of a gate or source/drain prevents high-speed operation. In order to overcome this problem, the salicide technology is under investigation, which reduces the resistance of a gate or source/drain by forming a low-resistance metal silicide layer such as nickel silicide layer or cobalt silicide layer on the surface of a conductive film configuring a gate or a semiconductor region configuring a source/drain by self alignment.

Japanese Unexamined Patent Application Publication No. 2007-013006 (Patent Document 1) and Japanese Unexamined Patent Application Publication No. 2010-056516 (Patent Document 2) describe a technology of a silicide block film.

PATENT DOCUMENTS

[Patent Document 1] Japanese Unexamined Patent Application Publication No. 2007-013006
[Patent Document 2] Japanese Unexamined Patent Application Publication No. 2010-056516

SUMMARY

There is a demand for the development of a semiconductor device having reliability as improved as possible even if it is equipped with a semiconductor element having a metal silicide layer.

Another problem and novel features will be apparent from the description herein and accompanying drawings.

In one embodiment, there is provided a method of manufacturing a semiconductor device having a step of forming a source/drain region for MISFET in a semiconductor substrate by ion implantation and a step of forming a first insulating film on the semiconductor substrate so as to cover, with it, a gate electrode for the MISFET and a sidewall insulating film on the side wall thereof. The method of manufacturing a semiconductor device further includes a step of, after the step of forming the first insulating film, performing first heat treatment, a step of forming a second insulating film on the first insulating film, and then forming a resist pattern on the second insulating film. The method of manufacturing a semiconductor device still further includes a step of, after the step of forming the resist pattern, etching the second insulating film and the first insulating film with the resist pattern as an etching mask, a step of removing the resist pattern, and then a step of carrying out wet washing treatment. The method of manufacturing a semiconductor device still further includes a step of, after the step of carrying out wet washing treatment, forming a metal film on the semiconductor substrate so as to cover the gate electrode and the sidewall insulating film, and then a step of carrying out second heat treatment to react the metal film with the source/drain region and thereby form a metal silicide layer on the source/drain region.

According to the one embodiment, a semiconductor device having improved reliability can be provided.

BRIEF DESCRIPTION OF THE DRAWINGS

FIG. 37 is a fragmentary cross-sectional view of the semiconductor device of Second Investigation Example during a manufacturing step thereof;

DETAILED DESCRIPTION

Figure 1:
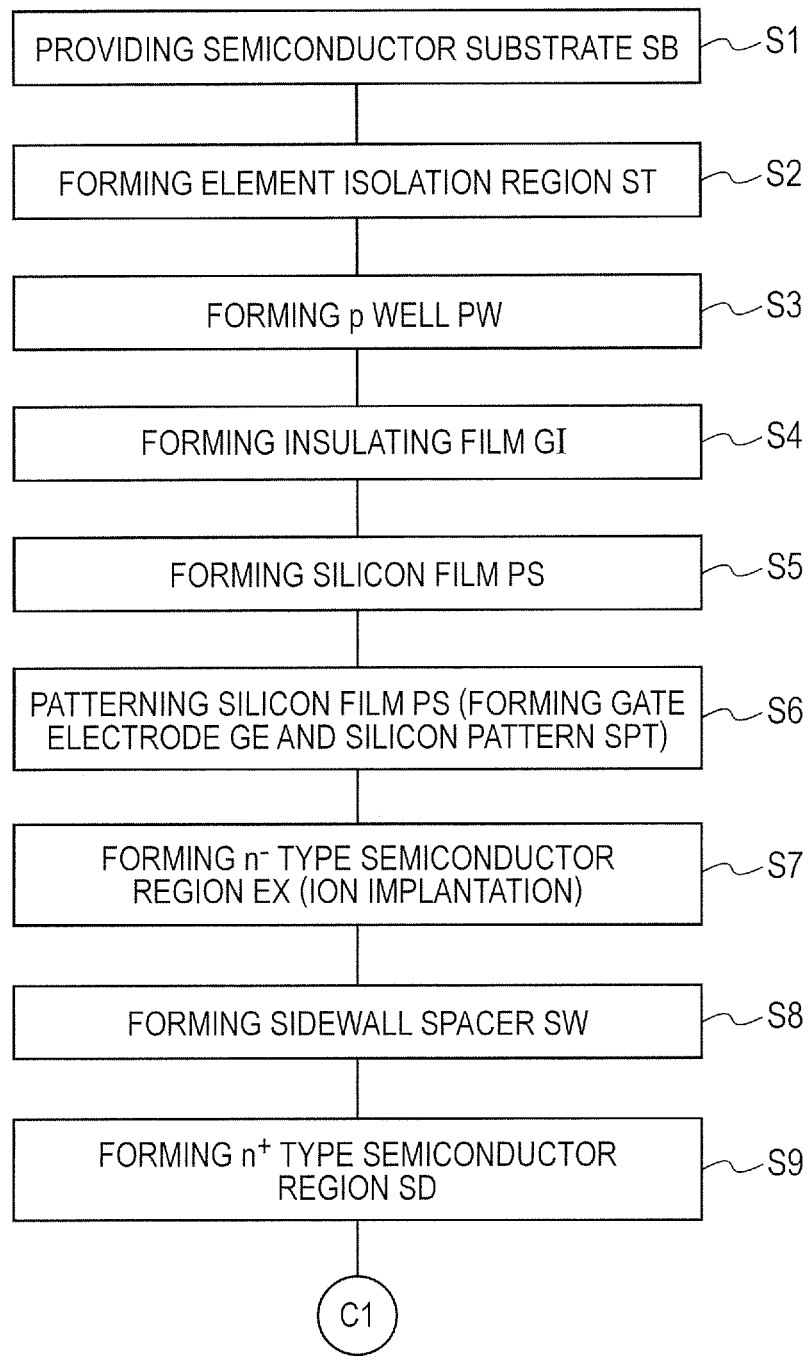
FIG. 1 is a process flow chart showing manufacturing steps of a semiconductor device of First Embodiment.

In the following embodiment, a description will be made after divided into a plurality of sections or embodiments if necessary for the sake of convenience. These sections or embodiments are not independent from each other unless otherwise particularly specified, but one of them may be a modification example, a detailed description, a complementary description, or the like of a portion or the whole of the other one. In the following embodiment, when a reference is made to the number or the like (including the number, value, amount, range, or the like) of a component, the number is not limited to a specific number but may be more or less than the specific number, unless otherwise particularly specified or principally apparent that the number is limited to the specific number. Further, it is needless to say that in the following embodiment, the constituent component (including component step or the like) is not always essential unless otherwise particularly specified or principally apparent that it is essential. Similarly, in the following embodiment, when a reference is made to the shape, positional relationship, or the like of the constituent component, that substantially approximate or analogous to its shape or the like is also embraced unless otherwise particularly specified or principally apparent that it is not. This also applies to the above-described number and range.

The embodiment will hereinafter be described in detail based on some drawings. In all the drawings for describing the embodiment, members having the same function will be identified by the same reference numeral and overlapping descriptions will be omitted. In the following embodiment, a description on the same or similar portion is not repeated in principle unless otherwise particularly necessary.

In the drawings used in the following embodiment, even from cross-sectional views, hatching may be omitted to facilitate viewing of them. Or, even a plan view may be hatched to facilitate viewing of it.

First Embodiment

<Structure of Semiconductor Device>

Figure 2:
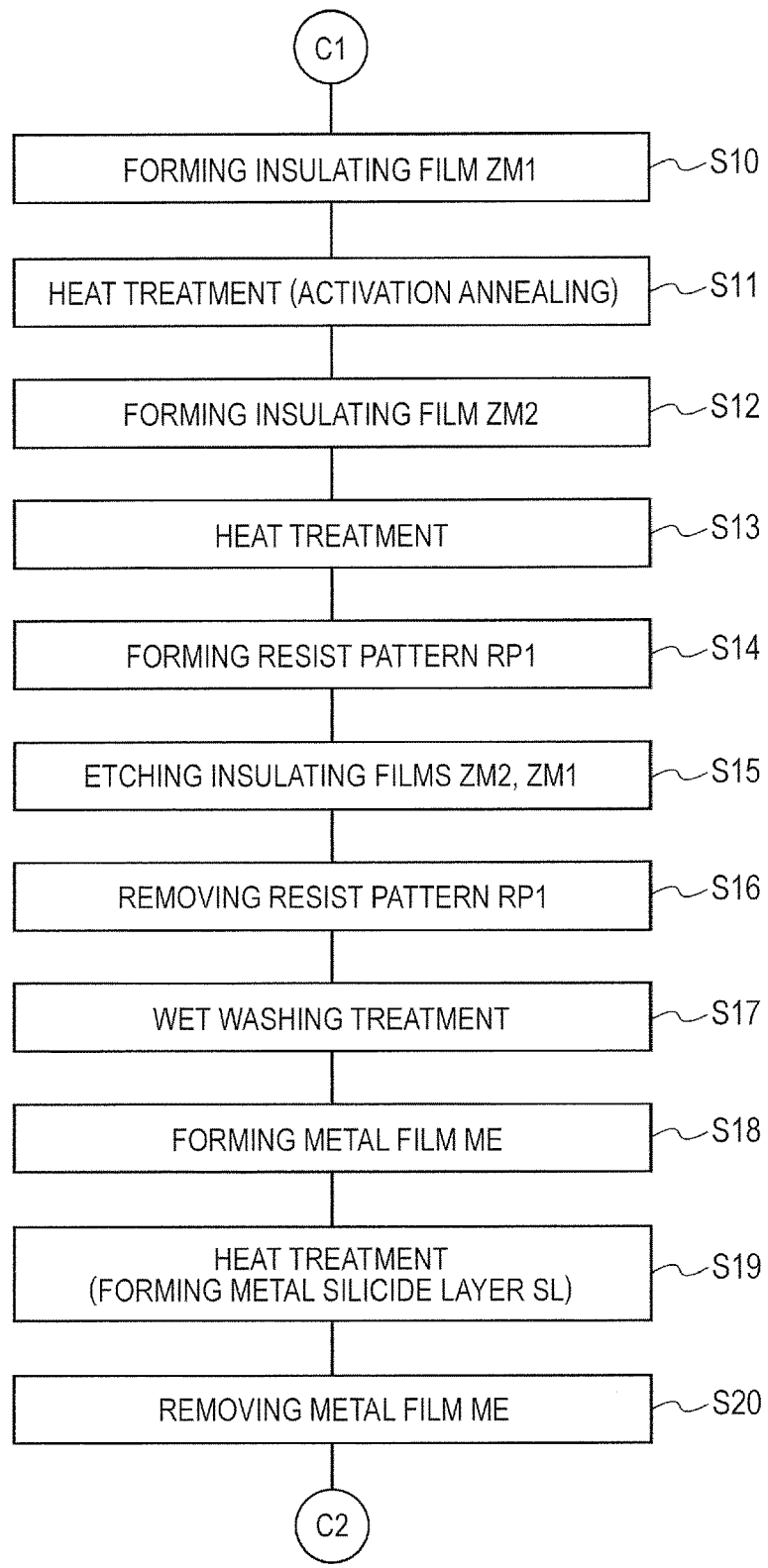
FIG. 2 is a process flow chart showing manufacturing steps of the semiconductor device following that of FIG. 1.
Figure 3:
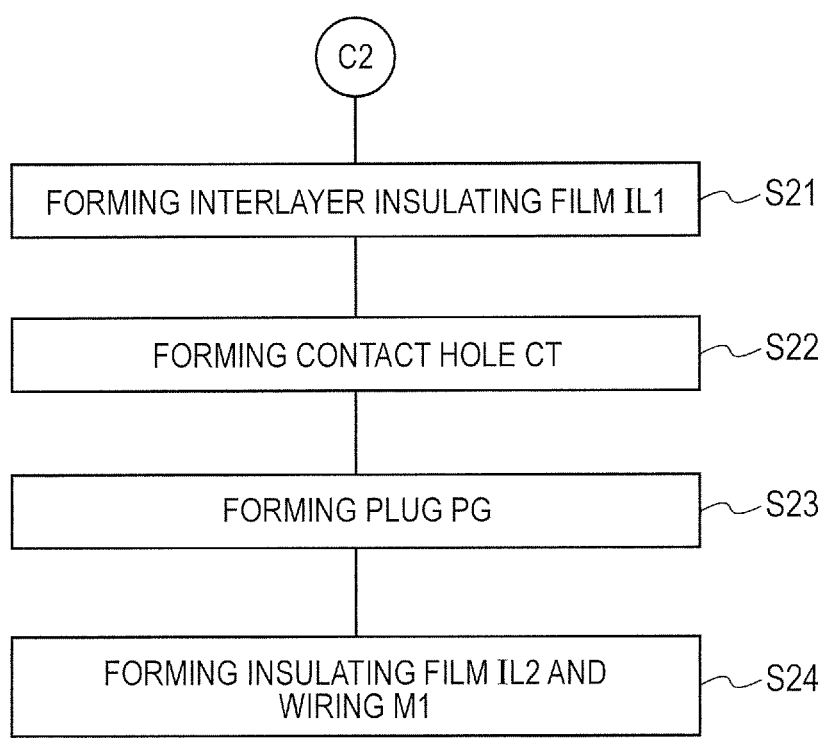
FIG. 3 is a process flow chart showing manufacturing steps of the semiconductor device following that of FIG. 2.

Manufacturing steps of the semiconductor device of First Embodiment of the invention will be described referring to drawings. FIGS. 1 to 3 are process flow charts showing some of manufacturing steps of the semiconductor device of First Embodiment. The process flow shown in FIG. 1 is successively followed by the process flow shown in FIG. 2 and the process flow shown in FIG. 3. FIGS. 4 to 24 are fragmentary cross-sectional views of the semiconductor device of First Embodiment during the manufacturing steps thereof. The cross-sectional views of FIGS. 4 to 24 show the fragmentary cross-sectional views of a MISFET formation region 1A and a resistive element formation region 1B, more specifically, how a MISFET is formed in the MISFET formation region 1A and how a polysilicon resistive element is formed in the resistive element formation region 1B.

Here, the MISFET formation region 1A is a region of (the main surface of) a semiconductor substrate SB in which a MISFET is to be formed. The resistive element formation region 1B is a region of (the main surface of) the semiconductor substrate in which a polysilicon resistive element is to be formed. One semiconductor substrate B has both the MISFET formation region 1A and the resistive element formation region 1B. In other words, the MISFET formation region 1A and the resistive element formation region 1B correspond to respectively different planar regions of the same semiconductor substrate SB. The MISFET formation region 1A and the resistive element formation region 1B may be adjacent to each other or may not be adjacent to each other. In the cross-sectional views of FIGS. 4 to 24, however, to facilitate understanding, the MISFET formation region 1A has, adjacent thereto, the resistive element formation region 1B.

In First Embodiment, formation of an n channel MISFET in the MISFET formation region 1A will be described. It is also possible to reverse the conductivity type to form a p channel MISFET in the MISFET formation region 1A, or to form both an n channel MISFET and a p channel MISFET in the MISFET formation region 1A.

Manufacturing steps of the semiconductor device of First Embodiment will hereinafter be described referring to FIGS. 1 to 24.

Figure 4:
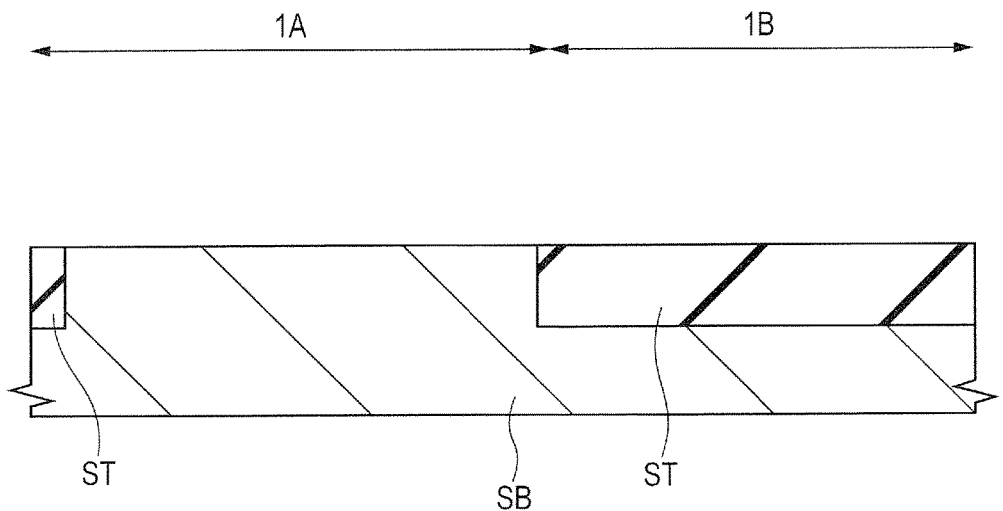
FIG. 4 is a fragmentary cross-sectional view of the semiconductor device of First Embodiment during a manufacturing step.

First, as shown in FIG. 4, a semiconductor substrate (semiconductor wafer) SB, for example, having a specific resistance of from about 1 to 10 Ωcm and made of p type single crystal silicon is provided (prepared) (Step S1 in FIG. 1). Then, an element isolation region ST is formed in the main surface of the semiconductor substrate SB (Step S2 in FIG. 1). The element isolation region ST is made of an insulator such as silicon oxide and can be formed using, for example, STI (shallow trench isolation).

Described specifically, after formation of an element isolation trench in the main surface of the semiconductor substrate SB by etching or the like, an insulating film made of silicon oxide or the like is formed on the semiconductor substrate SB so as to fill the element isolation trench with it. Then, the insulating film is polished using CMP (chemical mechanical polishing) or the like to remove an unnecessary portion of the insulating film outside the element isolation trench and leave the insulating film in the element isolation trench. Thus, the element isolation region ST made of the insulating film (insulator) that has filled the element isolation trench can be formed.

The element isolation region ST defines an active region of the semiconductor substrate SB. A MISFET will be formed, as will be described later, in the active region defined by the element isolation region ST in the MISFET formation region 1A. In the resistive element formation region 1B, on the other hand, the element isolation region ST is formed over the entirety thereof.

Figure 5:
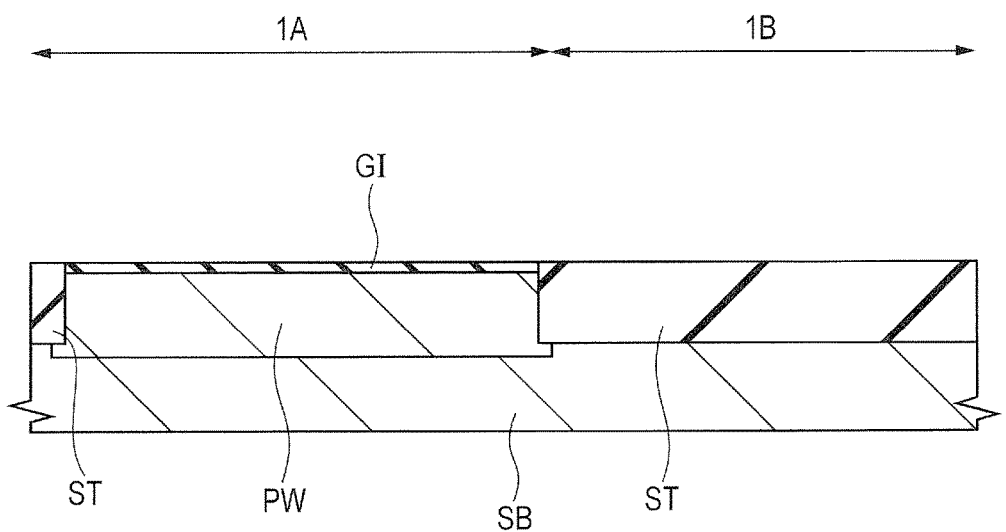
FIG. 5 is a fragmentary cross-sectional view of the semiconductor device during a manufacturing step following that of FIG. 4.

Next, as shown in FIG. 5, a p well (p type semiconductor region) PW having a predetermined depth from the main surface of the semiconductor substrate SB is formed (Step S3 in FIG. 1). The p well PW can be formed by the ion implantation of a p type impurity such as boron (B) into the semiconductor substrate SB. The p well PW is formed in the MISFET formation region 1A.

Next, after cleaning (washing) the surface of the semiconductor substrate SB, for example, by wet etching with an aqueous hydrofluoric acid (HF) solution, an insulating film (gate insulating film) GI made of a silicon oxide film or the like is formed on the surface (surface of the p well PW in the MISFET formation region 1A) of the semiconductor substrate SB (Step S4 in FIG. 1). The insulating film GI formed in the MISFET formation region 1A is an insulating film for a gate insulating film of a MISFET to be formed in the MISFET formation region 1A and it can be formed, for example, by thermal oxidation.

Figure 6:
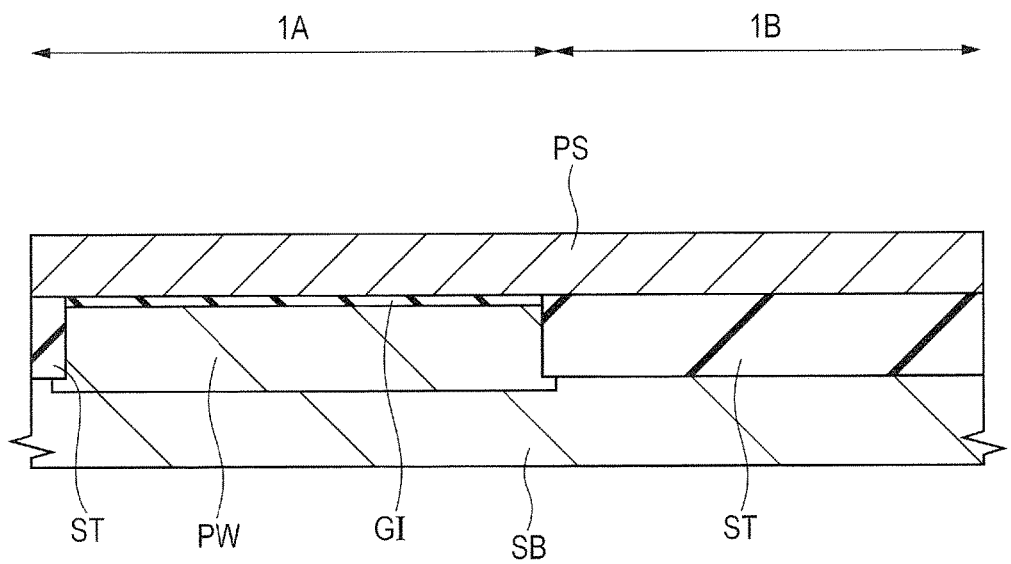
FIG. 6 is a fragmentary cross-sectional view of the semiconductor device during a manufacturing step following that of FIG. 5.

Next, as shown in FIG. 6, a silicon film PS like, for example, a polycrystalline silicon film (doped polysilicon film) is formed (deposited) as a conductive film on the entire main surface of the semiconductor substrate SB (Step S5 in FIG. 1). The silicon film PS is formed on the insulating film GI and the element isolation region ST. This silicon film PS is formed as a low-resistivity semiconductor film (conductive material film) by introducing an impurity at the time of or after film formation. As the silicon film PS, a polycrystalline silicon film converted from a silicon film, which is amorphous at the time of film formation, by the heat treatment after film formation may be used.

Figure 7:
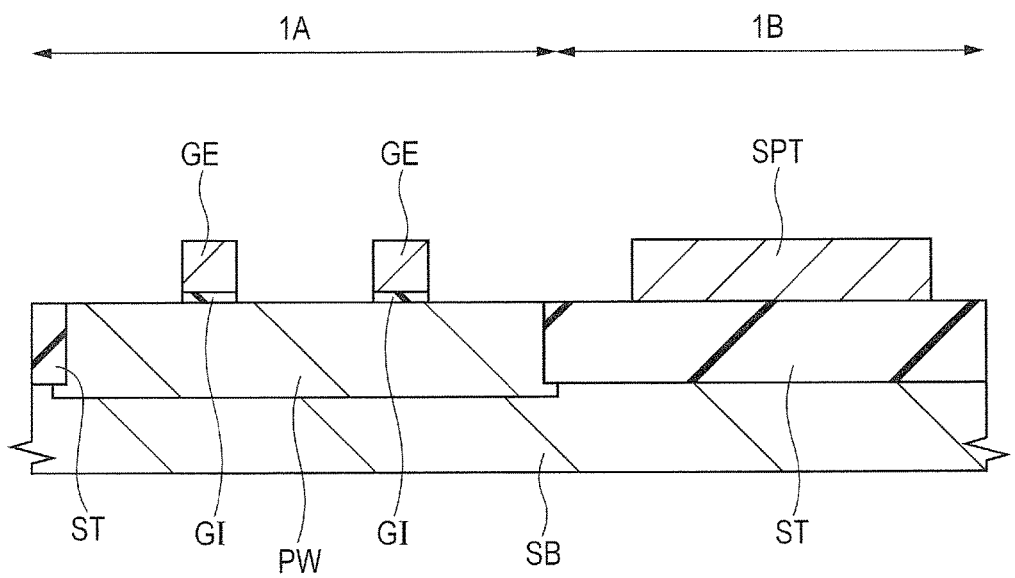
FIG. 7 is a fragmentary cross-sectional view of the semiconductor device during a manufacturing step following that of FIG. 6.

Next, the silicon film PS is patterned using photolithography and dry etching to form a gate electrode GE and a silicon pattern (silicon film pattern, polycrystalline silicon film pattern, conductive pattern) SPT for resistive element as shown in FIG. 7 (Step S6 in FIG. 1). The gate electrode GE and the silicon pattern SPT are each made of a patterned silicon film PS.

Of these, the gate electrode GE is formed via the insulating film GI on the p well PW in the MISFET formation region 1A. This means that the gate electrode GE is formed on the insulating film GI on the surface of the p well PW in the MISFET formation region 1A. The silicon pattern SPT is, on the other hand, formed on the element isolation region ST in the resistive element formation region 1B.

The silicon pattern SPT is a conductor pattern (conductor film pattern) functioning as a resistor and a resistive element (polysilicon resistive element) is formed from this silicon pattern SPT. This means that the silicon pattern SPT is a silicon pattern for resistive element (polysilicon resistive element). The silicon pattern SPT has a resistivity controlled by an impurity introduced therein.

Figure 8:
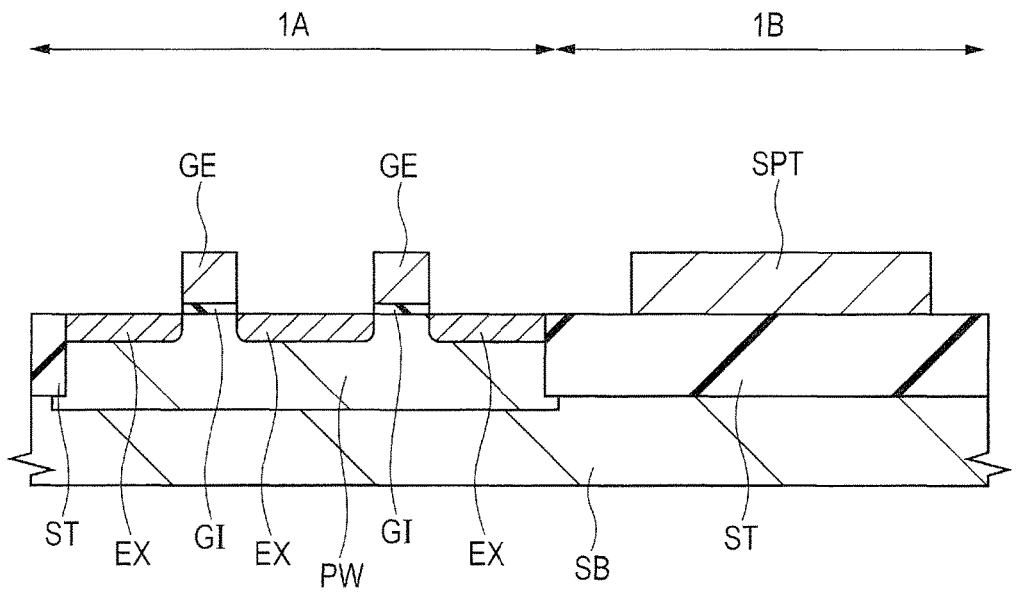
FIG. 8 is a fragmentary cross-sectional view of the semiconductor device during a manufacturing step following that of FIG. 7.

Next, as shown in FIG. 8, an n⁻ type semiconductor region (extension region) EX is formed, in the p well PW, on both sides of the gate electrode GE by the ion implantation of an n type impurity such as phosphorus (P) or arsenic (As) into the p well PW of the MISFET formation region 1A, with the gate electrode GE as a mask (ion implantation preventing mask) (Step S7 in FIG. 1). In short, the n⁻ type semiconductor region EX is formed using ion implantation. The gate electrode GE can function as an ion implantation preventing mask during the ion implantation of Step S7 so that an impurity is not ion-implanted into a region just below the gate electrode GE in the p well PW, and the n⁻ type semiconductor region EX is formed in self alignment with the side wall of the gate electrode GE.

Next, a sidewall spacer (sidewall insulating film) SW made of, for example, silicon oxide or silicon nitride, or a stacked film of them is formed, as a sidewall insulating film (insulating film), on the side wall of the gate electrode GE (Step S8 in FIG. 1). The sidewall spacer SW can be formed not only on the side wall of the gate electrode GE but also on the side wall of the silicon pattern SPT.

Figure 9:
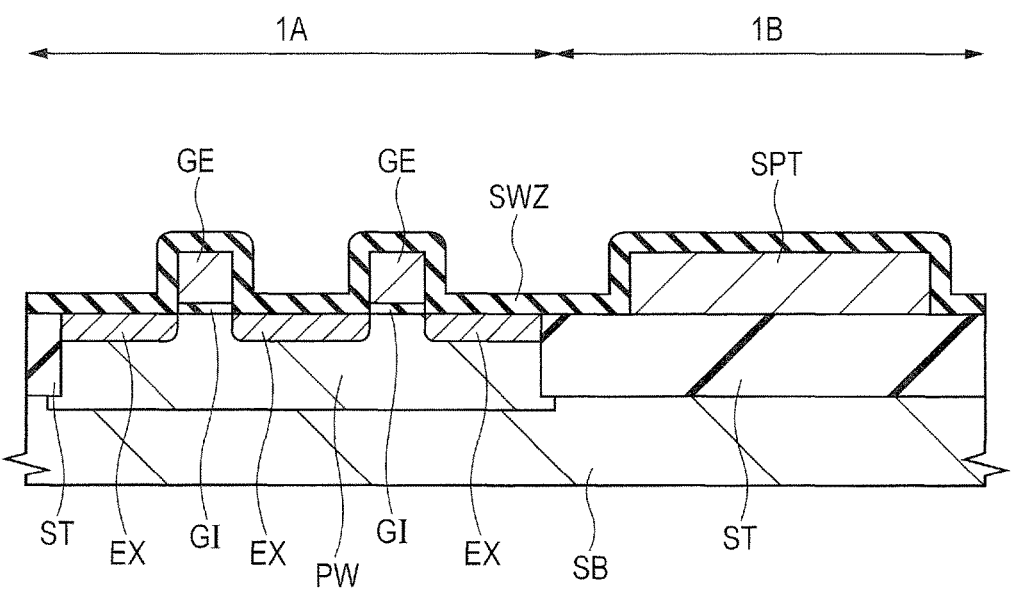
FIG. 9 is a fragmentary cross-sectional view of the semiconductor device during a manufacturing step following that of FIG. 8.
Figure 10:
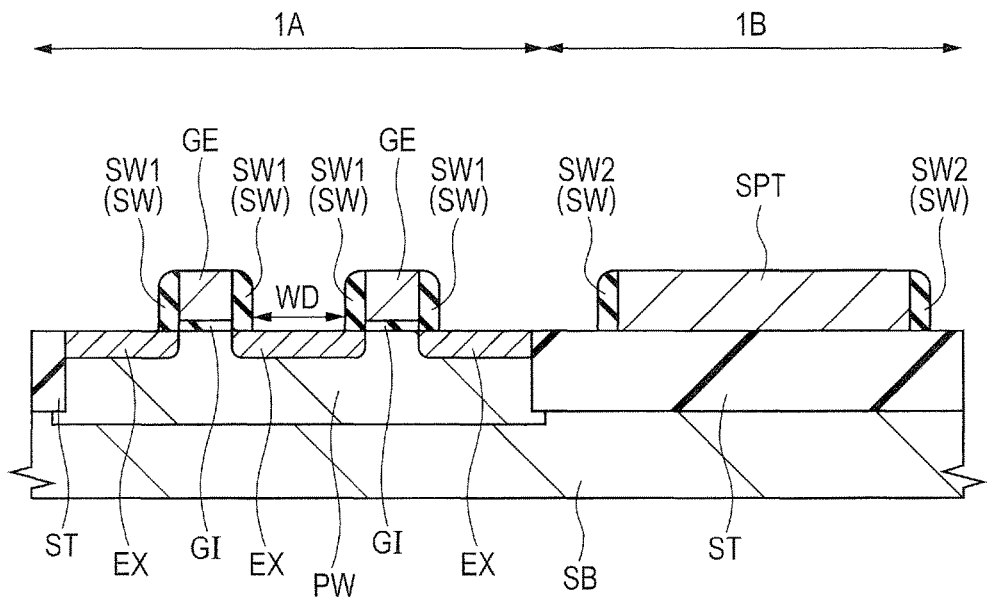
FIG. 10 is a fragmentary cross-sectional view of the semiconductor device during a manufacturing step following that of FIG. 9.

The sidewall spacer SW can be formed, for example, in the following manner. Described specifically, first, as shown in FIG. 9, an insulating film SWZ made of a silicon oxide film or a silicon nitride film, or a stacked film of them is formed on the entire main surface of the semiconductor substrate SB so as to cover the gate electrode GE and the silicon pattern SPT. Then, the resulting insulating film SWZ is anisotropically etched by RIE (reactive ion etching) or the like. By this anisotropic etching, a portion other than a portion which is to be the sidewall spacer SW is removed from the insulating film SWZ for the formation of the sidewall spacer SW and as shown in FIG. 10, the insulating film SWZ remains selectively on the side wall of the gate electrode GE and the side wall of the silicon pattern SPT. Thus, the sidewall spacer SW is formed.

It is to be noted that the sidewall spacer SW formed on the sidewall of the gate electrode GE will be attached with a reference numeral SW1 and called "sidewall spacer SW1" and the sidewall spacer SW formed on the side wall of the silicon pattern SPT will be attached with a reference numeral SW2 and called "sidewall spacer SW2".

Figure 11:
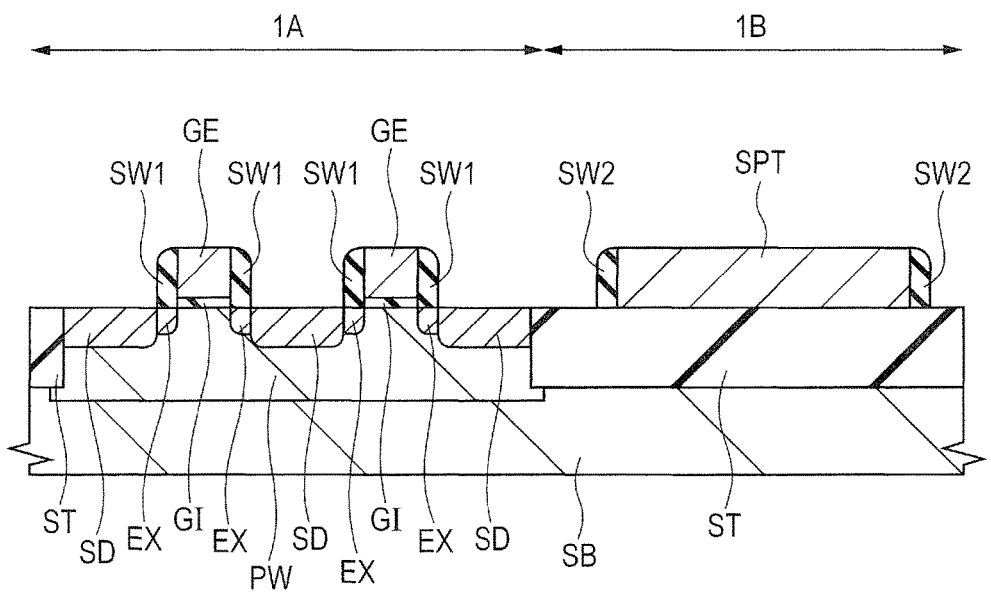
FIG. 11 is a fragmentary cross-sectional view of the semiconductor device during a manufacturing step following that of FIG. 10.

Next, as shown in FIG. 11, ion implantation is performed in the p well pW to form an $n^+$ type semiconductor region (source/drain region) SD on both sides of a structure comprised of the gate electrode GE and the sidewall spacer SW1 on the side wall thereof (Step S9 in FIG. 1). In short, the $n^+$ type semiconductor region SD is formed using ion implantation.

The ion implantation of Step S9 is performed by the ion implantation of an n type impurity such as phosphorus (P) or arsenic (As) into the p well PW in the MISFET formation region 1A with the gate electrode GE and the sidewall spacer SW1 on the side wall thereof as a mask (ion implantation preventing mask). During ion implantation in this Step S9, the gate electrode GE and the sidewall spacer SW1 on the side wall thereof can function as an ion implantation preventing mask so that no impurity is ion-implanted into a region just below the gate electrode GE in the p well PW and a region just below the sidewall spacer SW1 on the side wall of this gate electrode GE. The $n^+$ type semiconductor region SD is therefore formed in self alignment with the side surface (side surface on the side opposite to the side contiguous to the gate electrode GE) of the sidewall spacer SW1 on the side wall of the gate electrode GE.

The $n^+$ type semiconductor region SD has a junction depth larger and an impurity concentration (n type impurity concentration) higher than those of the $n^-$ type semiconductor region EX. As described above, the $n^-$ type semiconductor region EX is formed in self alignment with the side wall of the gate electrode GE and the $n^+$ type semiconductor region SD is formed in self alignment with the side wall of the sidewall spacer SW1 on the side wall of the gate electrode GE. The $n^-$ type semiconductor region EX having a low impurity concentration is formed below the sidewall spacer SW1 on the side wall of the gate electrode GE and the $n^+$ type semiconductor region SD having a high impurity concentration is formed outside the $n^-$ type semiconductor region EX having a low impurity concentration. The $n^-$ type semiconductor region EX having a low impurity concentration is therefore adjacent to a channel region, while the $n^+$ type semiconductor region SD having a high impurity concentration is adjacent to the $n^-$ type semiconductor region EX having a low impurity concentration and separated from the channel region by a distance of the $n^-$ type semiconductor region EX. The channel region of the MISFET is formed below the insulating film GI below the gate electrode GE.

The $n^+$ type semiconductor region SD has an impurity concentration higher than that of the $n^-$ type semiconductor region EX and an n type semiconductor region (impurity diffusion layer) functioning as a source or a drain of the n channel MISFET is formed from the $n^-$ type semiconductor region EX and the $n^+$ type semiconductor region SD. The source/drain region (semiconductor region for source or drain) of the n channel MISFET has therefore an LDD (lightly-doped drain) structure.

In such a manner, the n channel MISFET (metal insulator semiconductor field effect transistor) is formed in the MISFET formation region 1A (p well PW) as a field effect transistor. The n channel MISFET can be regarded as an n channel type field effect transistor. The $n^+$ type semiconductor region SD can be regarded as a semiconductor region (source/drain region) for the source or drain of the n channel MISFET. The gate electrode GE is a gate electrode of the n channel MISFET.

FIG. 11 shows, in the MISFET formation region 1A, (the gate electrodes GE) of MISFETs adjacent to each other in a gate length direction while having a source/drain region ($n^+$ type semiconductor region SD) in common.

Figure 12:
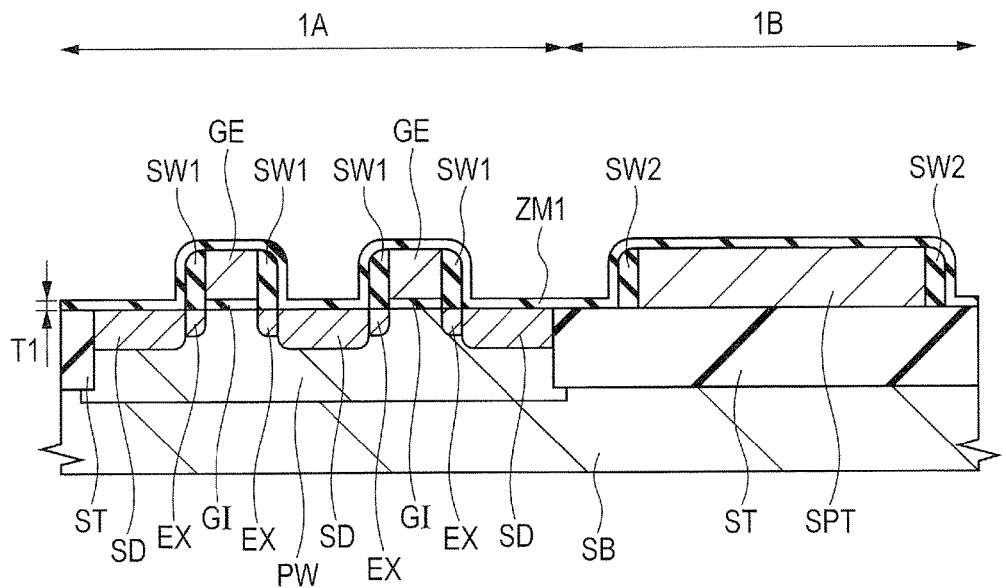
FIG. 12 is a fragmentary cross-sectional view of the semiconductor device during a manufacturing step following that of FIG. 11.

Next, as shown in FIG. 12, a silicide blocking insulating film (silicide block film) ZM1 is formed on the main surface (entire main surface) of the semiconductor substrate SB so as to cover the gate electrode GE, the silicon pattern SPT, and the sidewall spacers SW1 and SW2 on the side wall of them (Step S10 in FIG. 2). This insulating film ZM1 is formed in order to prevent a metal silicide layer SL from being formed by the salicide process in a region not requiring the metal silicide layer SL.

Figure 13:
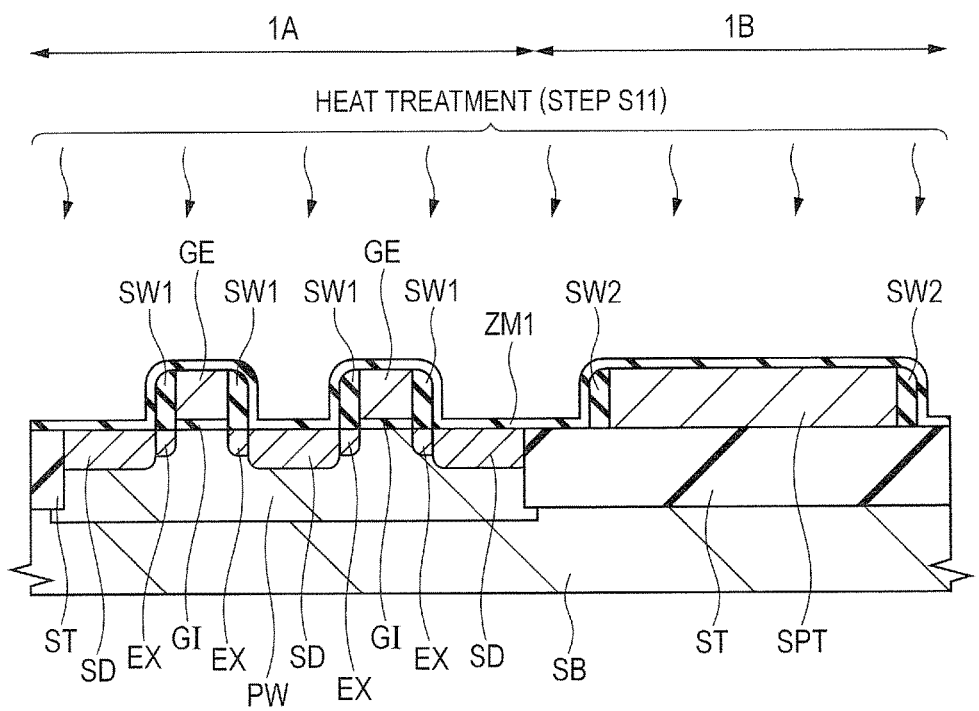
FIG. 13 is a fragmentary cross-sectional view of the semiconductor device during a manufacturing step following that of FIG. 12.

Next, as shown in FIG. 13, the semiconductor substrate SB is subjected to heat treatment (annealing) (Step S11 in FIG. 2). This heat treatment of Step S11 can be performed under normal pressure in an atmosphere of an inert gas (for example, argon (Ar) gas, neon (Ne) gas, or helium (He) gas), a nitrogen ($N_2$) gas, or a mixed gas of them, for example, by RTA (rapid thermal annealing). The impurity introduced until then is activated by the heat treatment of Step S11. More specifically, the impurity introduced in the gate electrode GE, silicon pattern SPT, $n^-$ type semiconductor region EX, and $n^+$ type semiconductor region SD can be activated by the heat treatment of Step S11. The heat treatment of Step S11 can therefore be regarded as activation annealing (activation annealing treatment). The ion implantation of Step S7 or ion implantation of Step S9 sometimes makes amorphous a portion of a substrate region (more specifically, region where the $n^-$ type semiconductor region EX and the $n^+$ type semiconductor region SD have been formed) into which an impurity has been implanted by the ion implantation, but the heat treatment of Step S11 can recrystallize the amorphous substrate region. The heat treatment of Step S11 is heat treatment at a relatively high temperature. The heat treatment temperature (first heat treatment temperature) of Step S11 is preferably 900° C. or more. For example, a temperature of from about 900 to 1050° C. can be preferably used.

Figure 14:
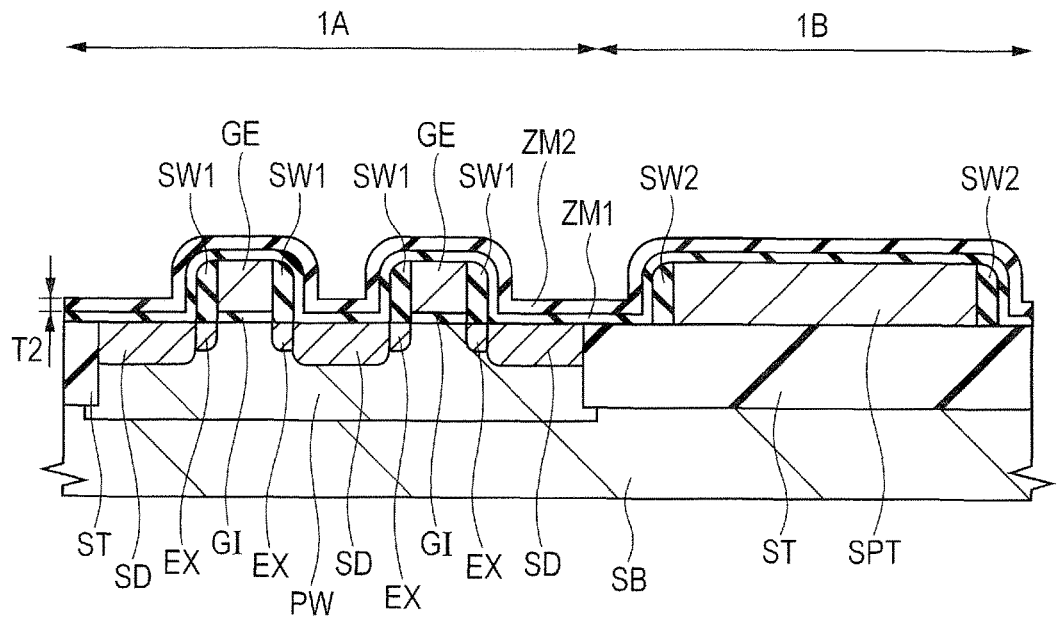
FIG. 14 is a fragmentary cross-sectional view of the semiconductor device during a manufacturing step following that of FIG. 13.

Next, as shown in FIG. 14, an insulating film ZM2 is formed on the main surface (entire main surface) of the semiconductor substrate SB, that is, on the insulating film ZM1 (Step S12 in FIG. 2).

Figure 15:
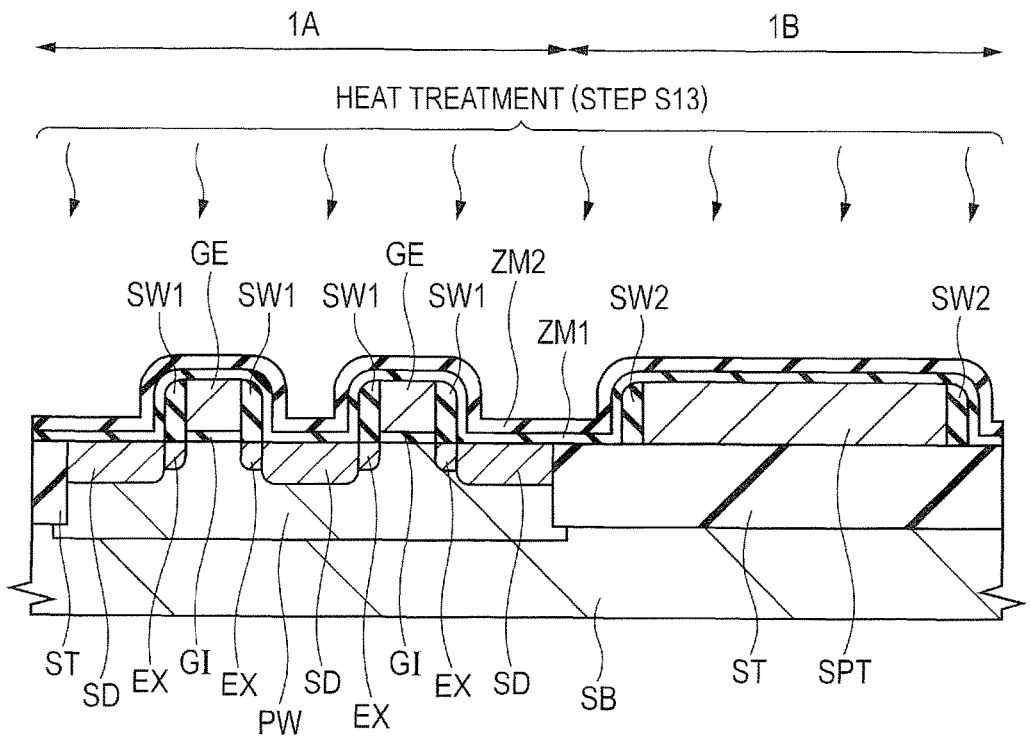
FIG. 15 is a fragmentary cross-sectional view of the semiconductor device during a manufacturing step following that of FIG. 14.

Next, as shown in FIG. 15, the semiconductor substrate SB is subjected to heat treatment (annealing) (Step S13 in FIG. 2). The heat treatment temperature of the heat treatment of Step S13 is lower than that of the heat treatment of Step S11. As the heat treatment temperature of Step S13, for example, a temperature of from 700 to 800° C. can be used. The heat treatment of Step S13 can be performed under normal pressure in an atmosphere of an inert gas (for example, argon (Ar) gas, neon (Ne) gas, or helium (He) gas), a nitrogen ($N_2$) gas, or a mixed gas of them. The heat treatment time of the heat treatment of Step S13 may be longer than that of the heat treatment of Step S11. Although details will be described later, the heat treatment of Step S13 can be omitted.

Figure 16:
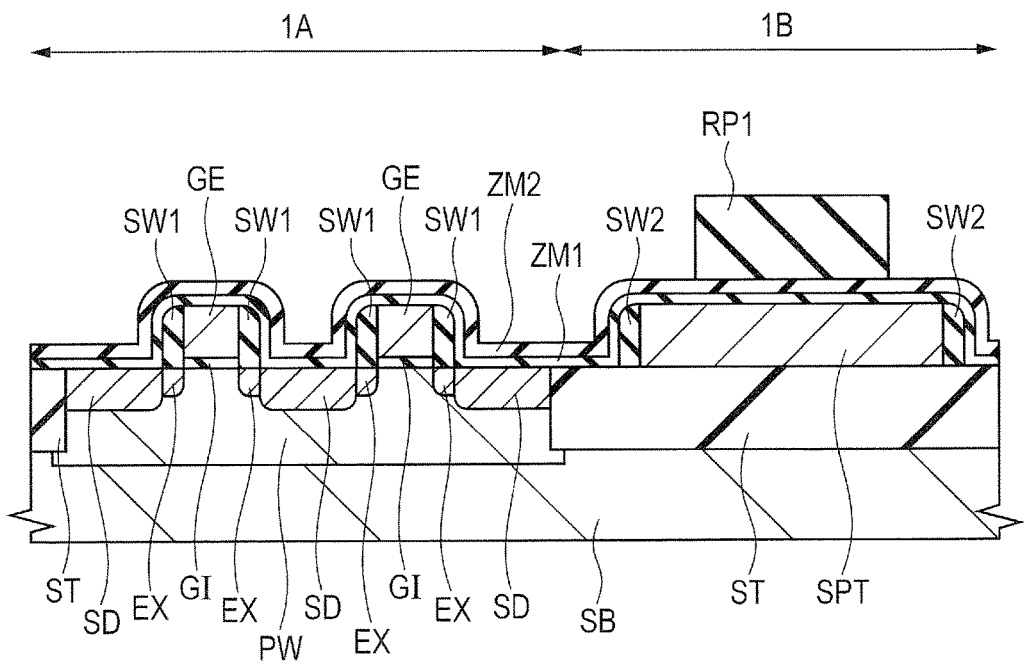
FIG. 16 is a fragmentary cross-sectional view of the semiconductor device during a manufacturing step following that of FIG. 15.

Next, as shown in FIG. 16, a resist pattern (photoresist pattern) RP1 serving as a mask layer on the insulating film ZM2 is formed by photolithography (Step S14 in FIG. 2). This photolithography is a technology of forming a resist film (photoresist film) on the entire main surface of a semiconductor substrate by the method of application or the like and then patterning the resist film by exposure/development of it into a desired resist pattern (photoresist pattern).

The resist pattern RP1 is formed in a region where the formation of the metal silicide layer SL by the salicide process should be prevented. In other words, the resist pattern RP1 is formed so as to expose a region where the metal silicide layer SL described later is to be formed and cover a region where the metal silicide layer SL described later should not be formed. The region where the formation of the metal silicide layer SL by the salicide process should be prevented is, for example, a region of the silicon pattern SPT where the metal silicide layer SL is not formed. The metal silicide layer SL will be formed later on the gate electrode GE and the $n^+$ type semiconductor region SD so that the resist pattern RP1 is not formed (disposed) on the gate electrode GE, on the sidewall spacer SW1 provided on the side wall of the gate electrode GE, and on the $n^+$ type semiconductor region SD (source/drain region). The resist pattern RP1 is therefore not formed in the MISFET formation region 1A but formed in a portion of the resistive element formation region 1B.

Figure 17:
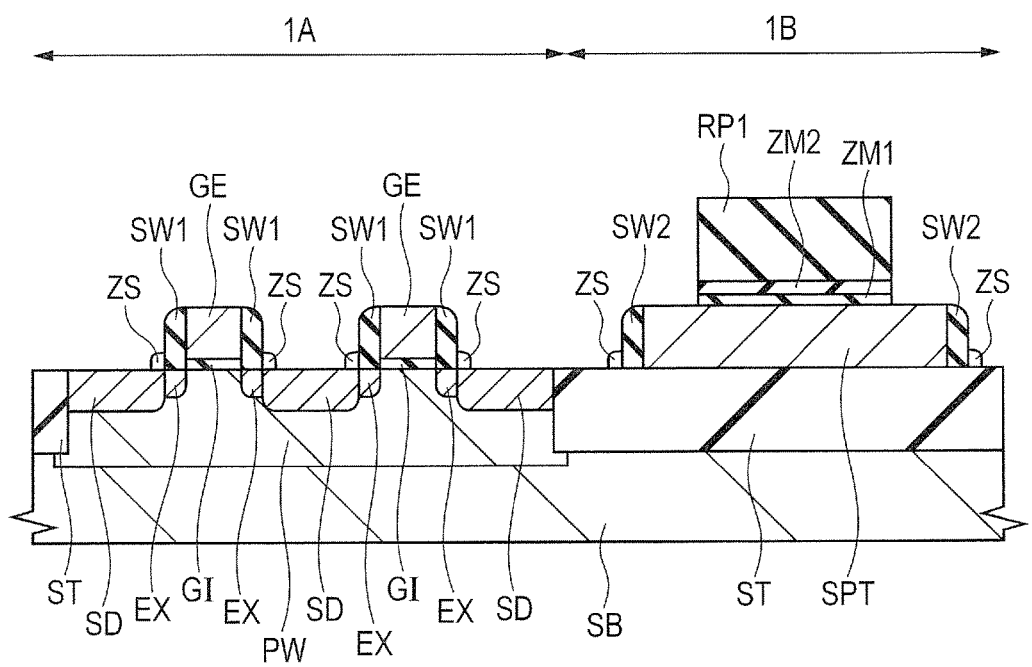
FIG. 17 is a fragmentary cross-sectional view of the semiconductor device during a manufacturing step following that of FIG. 16.

Next, as shown in FIG. 17, with the resist pattern RP1 as an etching mask, the insulating film ZM2 and the insulating film ZM1 are etched (Step S15 in FIG. 2).

As the etching of Step S15, dry etching is suited. Anisotropic dry etching is more preferred as the dry etching of Step S15, because using it can suppress side etching of the insulating films ZM2 and ZM1, leave the insulating films ZM1 and ZM2 having a planar shape almost the same as that of the resist pattern RP1 below the resist pattern RP1, and leave the insulating films ZM1 and ZM2 precisely at a position as designed.

By the etching of Step S15, a portion of the insulating films ZM2 and ZM1 (a portion of the insulating films ZM2 and ZM1 not located just below the resist pattern RP1) exposed without being covered with the resist pattern RP1 is removed by etching. On the other hand, a portion of the insulating films ZM2 and ZM1 covered with the resist pattern RP1 (a portion of the insulating films ZM2 and ZM1 located just below the resist pattern RP1) remains without being etched in Step S15.

The resist pattern RP1 is not formed above the gate electrode GE and the $n^+$ type semiconductor region SD. The insulating films ZM2 and ZM1 on the gate electrode GE and the $n^+$ type semiconductor region SD are removed by etching by the etching step of Step S15 so that the upper surface of the gate electrode GE and the upper surface of the $n^+$ type semiconductor region SD are exposed without being covered with the insulating films ZM1 and ZM2. The resist pattern RP1 is not formed above a region of the silicon pattern SPT where the metal silicide layer SL is to be formed. When the etching step of Step S15 is performed, the insulating films ZM2 and ZM1 on the region of the silicon pattern SPT where the metal silicide layer SL is to be formed are removed by etching so that the upper surface of the silicon pattern SPT in a region where the metal silicide layer SL is to be formed is exposed without being covered with the insulating films ZM1 and ZM2. On the other hand, the resist pattern RP1 is formed above a region of the silicon pattern SPT where the metal silicide layer SL is not to be formed. When the etching step of Step S15 is performed, the insulating films ZM2 and ZM1 on the region of the silicon pattern SPT where the metal silicide layer SL is not to be formed remain without being etched so that the upper surface of the silicon pattern SPT where the metal silicide layer SL is not to be formed is not exposed and remains covered with the insulating films ZM1 and ZM2.

Figure 18:
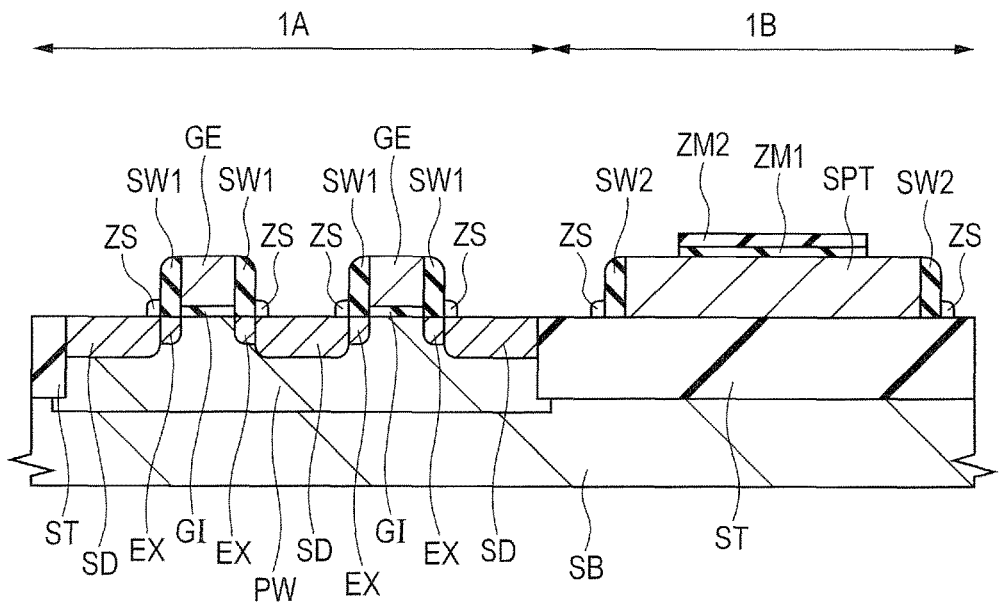
FIG. 18 is a fragmentary cross-sectional view of the semiconductor device during a manufacturing step following that of FIG. 17.

Next, as shown in FIG. 18, the resist pattern RP1 is removed using asking or the like (Step S16 in FIG. 2).

Figure 19:
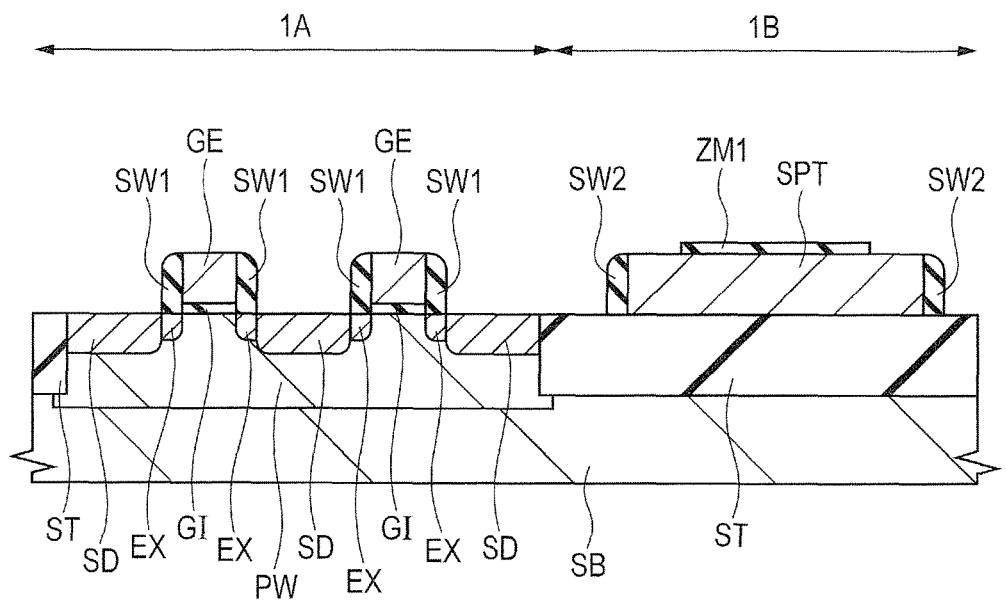
FIG. 19 is a fragmentary cross-sectional view of the semiconductor device during a manufacturing step following that of FIG. 18.

Next, washing treatment (wet washing treatment) is performed (Step S17 in FIG. 2). FIG. 19 shows the state after washing treatment of Step S17. The washing treatment of Step S17 is washing treatment using a chemical solution (washing solution), that is, wet washing treatment. A chemical solution having etching effects is used as the chemical solution in the washing treatment of Step S17 so that the washing treatment of Step S17 can also be regarded as wet etching treatment.

The chemical solution (washing liquid) to be used in the washing treatment of Step S17 differs, depending on the material of the insulating film ZM1 or ZM2. When the insulating film ZM1 or ZM2 is made of silicon oxide, for example, hydrofluoric acid (dilute hydrofluoric acid, diluted hydrofluoric acid, aqueous solution of hydrofluoric acid) may be used.

The etching step of Step S15 is performed without having the resist pattern RP1 above the $n^+$ type semiconductor region SD, the gate electrode GE, and the sidewall spacer SW1 on the side wall thereof. When the etching step of Step S15 is performed, the insulating films ZM2 and ZM1 on the $n^+$ type semiconductor region SD, the gate electrode GE, and the sidewall spacer SW1 on the side wall of the gate electrode GE are removed by etching. When the etching step of Step S15 is performed, the surface of the $n^+$ type semiconductor region SD, the surface of the gate electrode GE, and the surface of the sidewall spacer SW1 on the side wall of the gate electrode GE are exposed without being covered with the insulating films ZM1 and ZM2.

When the etching of Step S15 is finished, a residual portion (remaining portion) ZS of the insulating films ZM1 and ZM2 sometimes remains at a position adjacent to the lower portion of the side surface (lower portion of the side surface on the side opposite to the side contiguous to the gate electrode GE) of the sidewall spacer SW1 on the side wall of the gate electrode GE. In this case, the residual portion ZS of the insulating films ZM1 and ZM3 may remain also at a position adjacent to the lower portion of the side surface of the sidewall spacer SW2 on the side wall of the silicon pattern SPT. This residual portion ZS is made of a portion of the insulating film ZM1 or a portion of the insulating film ZM1 and a portion of the insulating film ZM2. When a metal film ME formation step as described later is performed while having the residual portion ZS, a metal silicide layer SL described later is not formed on the surface of a portion of the $n^+$ type semiconductor region SD covered with this residual portion ZS. This residual portion ZS should therefore be removed. In First Embodiment, the washing step of Step S17 is performed so that even if the residual portion ZS appears in the etching step of Step S15, this residual portion ZS can be removed by etching in the washing treatment of Step S17. Formation failure of the metal silicide layer SL described later due to the residual portion ZS can therefore be suppressed or prevented.

In Step S16, the resist pattern RP1 is removed, but a residue of the resist pattern RP1 may remain because the resist pattern RP1 cannot be removed completely. When the step of forming a metal film ME described later is performed while having the residue of the resist pattern RP1, the metal silicide layer SL described later is not formed in a portion covered with the residue of this resist pattern RP1 even if it is a region where the metal silicide layer SL described later is to be formed. The residue of the resist pattern RP1 is desirably removed. In First Embodiment, since the washing step of Step S17 is performed, the residue of this resist pattern RP1 can be removed by etching in the washing treatment of Step S17 even if the residue of the resist pattern RP1 appears in the resist pattern RP1 removing step of Step S16. It is therefore possible to suppress or prevent occurrence of the formation failure of the metal silicide layer SL described later caused by the residue of the resist pattern RP1.

In addition, by the washing treatment of Step S17, the surface on which the metal silicide layer SL described later is to be formed (here, the surface of the $n^+$ type semiconductor region SD, the surface of the gate electrode GE, and the surface of a portion of the silicon pattern SPT not covered with the insulating film ZM1) is cleaned to expose it precisely. For example, even when the $n^+$ type semiconductor region SD, the gate electrode GE, or the silicon pattern SPT has a surface having thereon an unintended natural oxide film, the washing treatment of Step S17 enables removal of the natural oxide film to expose the surface of the $n^+$ type semiconductor region SD, the gate electrode GE, or the silicon pattern SPT. The surface of a portion of the silicon pattern SPT where the metal silicide layer SL is not formed is however covered with the insulating film ZM1. The metal silicide layer SL described later can be formed precisely in a predetermined region by carrying out the metal film ME formation step described later while precisely exposing the surface on which the metal silicide layer SL is to be formed.

Figure 20:
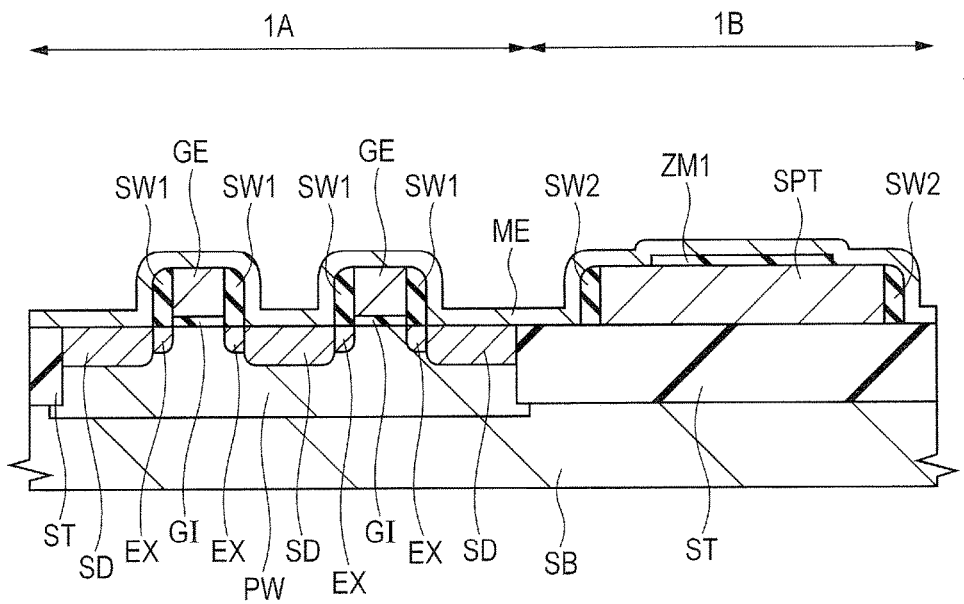
FIG. 20 is a fragmentary cross-sectional view of the semiconductor device during a manufacturing step following that of FIG. 19.

Next, as shown in FIG. 20, a metal film ME is formed on the main surface (entire main surface) of the semiconductor substrate SB including the $n^+$ type semiconductor region SD, the gate electrode GE, and the silicon pattern SPT (Step S18 in FIG. 2). In other words, in Step S18, the metal film ME is formed on the semiconductor substrate SB including the $n^+$ type semiconductor region SD so as to cover the gate electrode GE, the silicon pattern SPT, and the sidewall spacers SW1 and SW2. The metal film ME is made of a cobalt (Co) film or a nickel (Ni) film and can be formed using, for example, sputtering. An alloy film (for example, a nickel-platinum alloy film) can also be used as the metal film ME.

In Step S18, the metal film ME is formed while exposing the upper surface of the $n^+$ type semiconductor region SD, the upper surface of the gate electrode GE, and the upper surface of a portion of the silicon pattern SPT not covered with the insulating films ZM1 and ZM2. When the metal film ME is formed in Step S18, therefore, the upper surface of the $n^+$ type semiconductor region SD, the upper surface of the gate electrode GE, and the upper surface of a portion of the silicon pattern SPT not covered with the insulating films ZM1 and ZM2 are in contact with the metal film ME.

Next, the semiconductor substrate SB is subjected to heat treatment (annealing) (Step S19 in FIG. 2). The heat treatment of Step S19 can be performed under normal pressure in an atmosphere of an inert gas (for example, argon (Ar) gas, neon (Ne) gas, or helium (He) gas), a nitrogen ($N_2$) gas, or a mixed gas of them by using, for example, RTA.

Figure 21:
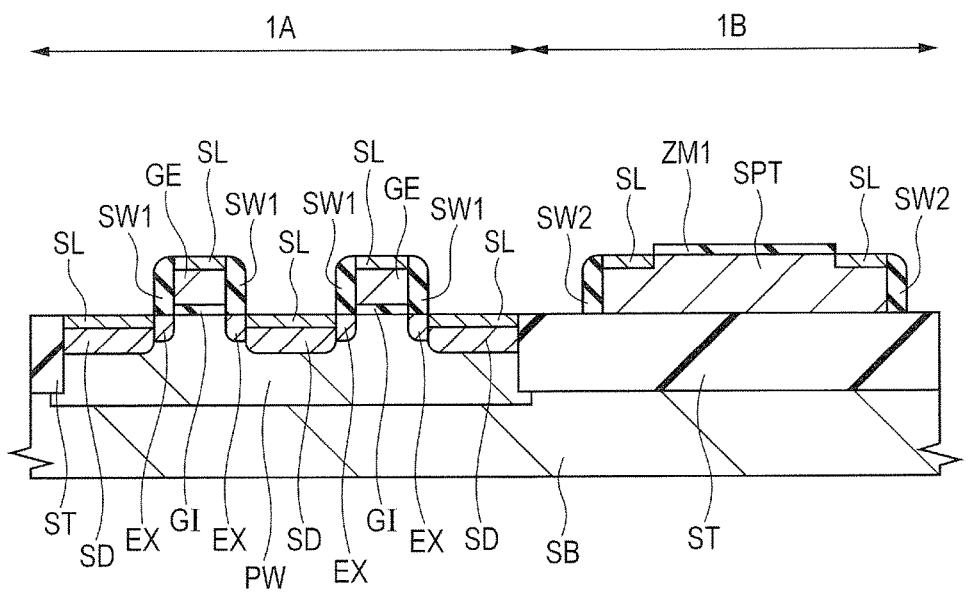
FIG. 21 is a fragmentary cross-sectional view of the semiconductor device during a manufacturing step following that of FIG. 20.

By the heat treatment of Step S19, as shown in FIG. 21, single crystal silicon configuring the $n^+$ type semiconductor region SD and the metal film ME, the polycrystalline silicon configuring the gate electrode GE and the metal film ME, and the polycrystalline silicon configuring the silicon pattern SPT and the metal film ME are reacted selectively to form a metal silicide layer (metal silicide film) SL which is a metal-semiconductor reaction layer. Since the metal silicide layer SL is formed by the reaction of the upper portion (upper layer portion) of each of the $n^+$ type semiconductor region SD, gate electrode GE, and silicon pattern SPT with the metal film ME, the metal silicide layer SL is formed on the surface (upper layer portion) of each of the $n^+$ type semiconductor region SD, gate electrode GE, and silicon pattern SPT.

Next, wet washing treatment (wet etching treatment) is performed to remove an unreacted portion of the metal film ME (that is, a portion of the metal film ME that has not reacted with the $n^+$ type semiconductor region SD, gate electrode GE, or silicon pattern SPT in the heat treatment step of Step S19) (Step S20 in FIG. 2). During this treatment, the unreacted portion of the metal film ME on the metal silicide layer SL is removed, but the metal silicide layer SL is left on the surface of the $n^+$ type semiconductor region SD, gate electrode GE, and silicon pattern SPT. In the wet washing treatment of Step S20, used is a chemical solution capable of selectively removing the unreacted portion of the metal film ME and retarding the etching rate of the metal silicide layer SL compared with that of the metal film ME. Although depending on the material of the metal film ME, the wet washing treatment of Step S20 can be performed, for example, by wet washing with sulfuric acid or wet washing with sulfuric acid and aqueous hydrogen peroxide. FIG. 21 shows a stage after removal of the unreacted portion of the metal film ME by the wet washing treatment of Step S20.

After removal of the unreacted portion of the metal film ME by Step S20, the semiconductor substrate SB is subjected to heat treatment (annealing) further as needed to react the metal silicide layer SL with the $n^+$ type semiconductor region SD, gate electrode GE, or silicon pattern SPT that lies below the metal silicide layer. This heat treatment following Step S20 can be performed under normal pressure in an atmosphere of an inert gas (for example, argon (Ar) gas, neon (Ne) gas, or helium (He) gas), a nitrogen ($N_2$) gas, or a mixed gas of them by using, for example, RTA. This heat treatment performed after Step S20 can be performed at a heat treatment temperature higher than that of the heat treatment of Step S19.

Thus, using the salicide (self aligned silicide) process, the metal silicide layer SL is formed.

When the metal film ME is a cobalt (Co) film, the metal silicide layer SL is a cobalt silicide layer; and when the metal film ME is a nickel (Ni) film, the metal silicide layer is a nickel silicide layer. When the metal film ME is a nickel-platinum (Ni—Pt) alloy film, the metal silicide layer is a nickel platinum silicide layer (platinum-added nickel silicide layer).

In Step S18, the metal film ME is formed while exposing the entire upper surface of the $n^+$ type semiconductor region SD and the entire upper surface of the gate electrode GE. The metal silicide layer SL is therefore formed on the entire upper surface of the $n^+$ type semiconductor region SD and the entire upper surface of the gate electrode GE. On the other hand, the metal film ME is formed in Step S18 while having a portion of the upper surface of the silicon pattern SPT covered with the insulating films ZM1 and ZM2 and a portion exposed without being covered with the insulating films ZM1 and ZM2. The metal silicide layer SL is formed on the portion of the upper surface of the silicon pattern SPT not covered with the insulating films ZM1 and ZM2, while the metal silicide layer SL is not formed on the portion of the upper surface of the silicon pattern SPT covered with the insulating films ZM1 and ZM2. This means that since the portion of the upper surface of the silicon pattern SPT not covered with the insulating films ZM1 and ZM2 is in contact with the metal film ME, the metal silicide layer SL is formed by the heat treatment of Step S19. The portion of the upper surface of the silicon pattern SPT covered with the insulating films ZM1 and ZM2 does not come into contact with the metal film ME even if the metal film ME is formed and due to presence of the insulating films ZM1 and ZM2 between the metal film ME and the silicon pattern, the metal silicide layer SL is not formed. This makes it possible to form the metal silicide layer SL not on the entire upper surface but on a portion of the upper surface of the silicon pattern SPT.

By forming the metal silicide layer SL on the surface (upper surface) of the n$^+$ type semiconductor region SD and the gate electrode GE and on a portion of the surface (upper surface) of the silicon pattern SPT (region to which the bottom portion of a plug PG described later is to be coupled), the diffusion resistance or contact resistance can be reduced and the resistive element region of the silicon pattern SPT can be defined. For example, when the metal silicide layer SL is formed partially on the upper surface at both ends of the silicon pattern SPT, the silicon pattern SPT in a region not having therein the metal silicide layer SL between the metal silicide layers SL at both ends can function as a resistive element region. This means that the silicon pattern SPT can be functioned as a resistive element (polysilicon resistive element) effectively by forming the metal silicide layer SL in a region, on the upper surface of the silicon pattern SPT, to be coupled to the plug PG described later but not forming the metal silicide layer SL in the other region by covering it with the insulating films ZM1 and ZM2.

Figure 22:
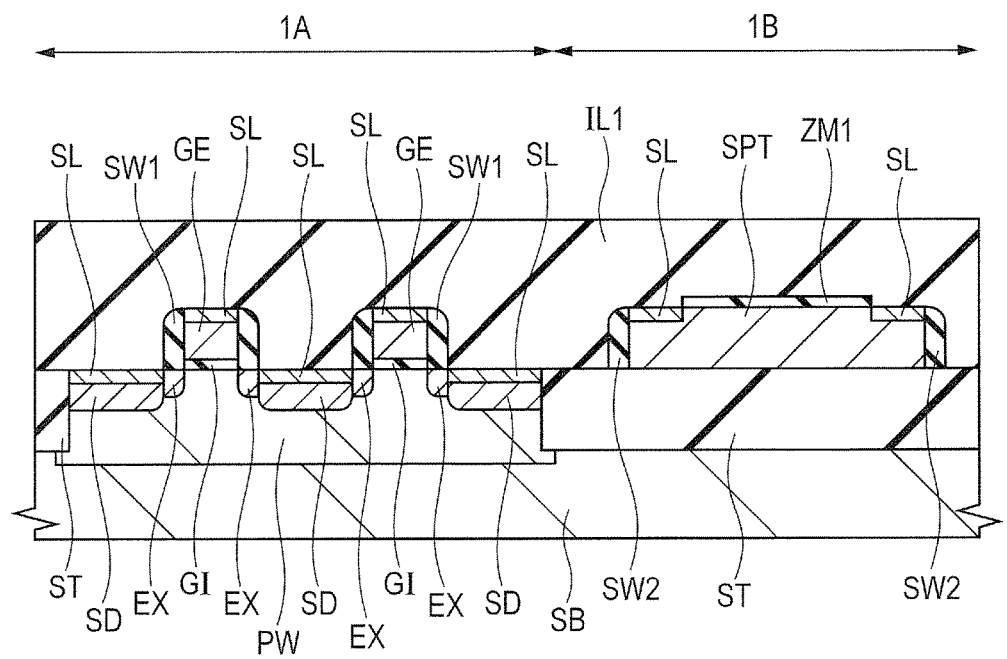
FIG. 22 is a fragmentary cross-sectional view of the semiconductor device during a manufacturing step following that of FIG. 21.

Next, as shown in FIG. 22, an interlayer insulating film IL1 is formed on the main surface (entire main surface) of the semiconductor substrate SB so as to cover the gate electrode GE, the silicon pattern SPT, and the sidewall spacer SW (SW1 and SW2) (Step S21 in FIG. 3). The interlayer insulating film IL1 is made of, for example, a single silicon oxide film or a stacked film of a silicon nitride film and a silicon oxide film on the silicon nitride film. The interlayer insulating film IL1 can be formed using, for example, CVD (chemical vapor deposition). The interlayer insulating film IL1 can have a planarized upper surface by polishing, after formation of the interlayer insulating film IL1, polishing the upper surface of the interlayer insulating film IL1 as needed by CMP (chemical mechanical polishing) or the like.

Figure 23:
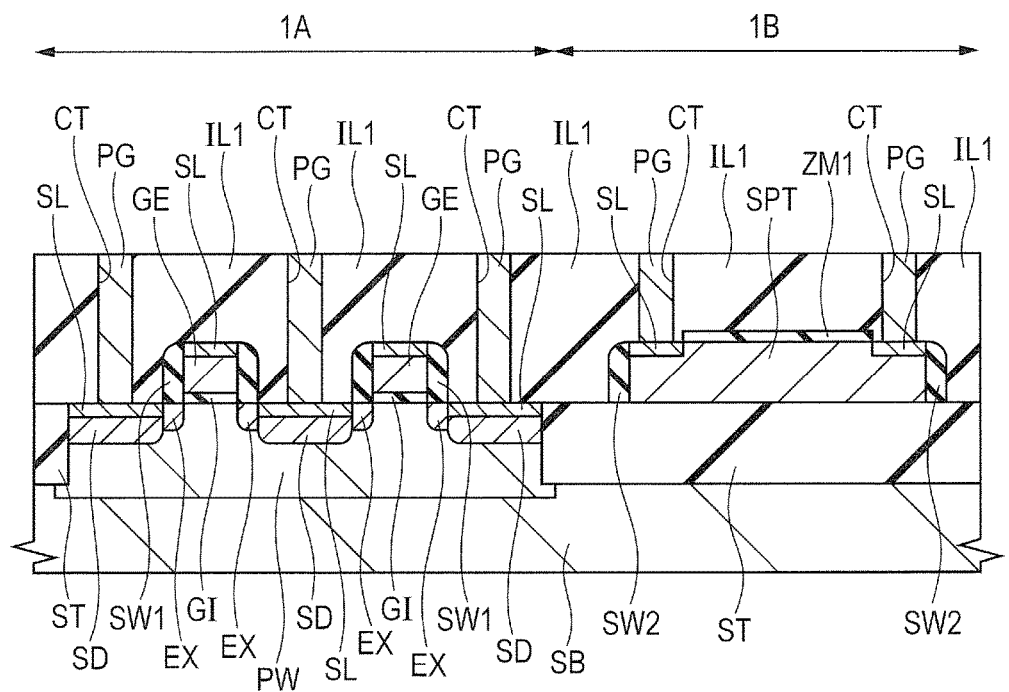
FIG. 23 is a fragmentary cross-sectional view of the semiconductor device during a manufacturing step following that of FIG. 22.

Next, a contact hole CT is formed in the interlayer insulating film IL1 as shown in FIG. 23 by forming a photoresist pattern (not shown) on the interlayer insulating film IL1 by photolithography and etching the interlayer insulating film IL1 with this photoresist pattern as an etching mask (Step S22 in FIG. 3). The contact hole CT is formed on the n$^+$ type semiconductor region SD, on the gate electrode GE, and on the silicon pattern SPT. The contact hole CT formed on the n$^+$ type semiconductor region SD and the contact hole CT formed on the silicon pattern SPT are shown in FIG. 23, but the contact hole CT formed on the gate electrode GE is not shown in the cross-section of FIG. 23. From the bottom portion of the contact hole CT formed on the n$^+$ type semiconductor region SD, the metal silicide layer SL formed on the surface of the n$^+$ type semiconductor region SD is exposed and from the bottom portion of the contact hole CT formed on the gate electrode GE, the metal silicide layer SL formed on the surface of the gate electrode GE is exposed. From the bottom portion of the contact hole CT formed on the silicon pattern SPT, the metal silicide layer SL formed on the surface of the silicon pattern SPT is exposed.

Next, a conductive plug PG made of tungsten (W) or the like is formed in the contact hole CT as a coupling conductor portion (Step S23 in FIG. 3).

The plug PG is formed in the following manner. For example, a barrier conductor film is formed on the interlayer insulating film IL1 and also on the bottom portion and the side wall of the contact hole CT. This barrier conductor film is made of, for example, a titanium film or a titanium nitride film, or a stacked film thereof. A main conductor film made of a tungsten film or the like is formed on the barrier conductor film so as to fill the contact hole CT therewith. Then, by removing an unnecessary portion of the main conductor film and the conductor film on the interlayer insulating film IL1 by CMP, etch-back, or the like method, a plug PG can be formed. To simplify the drawing, FIG. 23 shows the barrier conductor film and the main conductor film configuring the plug PG as one film.

The plug PG that has filled the contact hole CT formed over the n$^+$ type semiconductor region SD comes into contact with and is electrically coupled to, at the bottom portion of the plug, the metal silicide layer SL formed on the surface of the n$^+$ type semiconductor region SD. The plug PG (not shown) that has filled the contact hole CT formed on the gate electrode GE comes into contact with and is electrically coupled to, at the bottom portion of the plug, the metal silicide layer SL formed on the surface of the gate electrode GE. The plug PG that has filled the contact hole CT formed on the silicon pattern SPT comes into contact with and is electrically coupled to, at the bottom portion of the plug, the metal silicide layer SL formed on the surface of the silicon pattern SPT.

Next, a wiring M1 as a first-layer wiring is formed on the interlayer insulating film IL in which the plug PG has been buried (Step S24 in FIG. 3).

Figure 24:
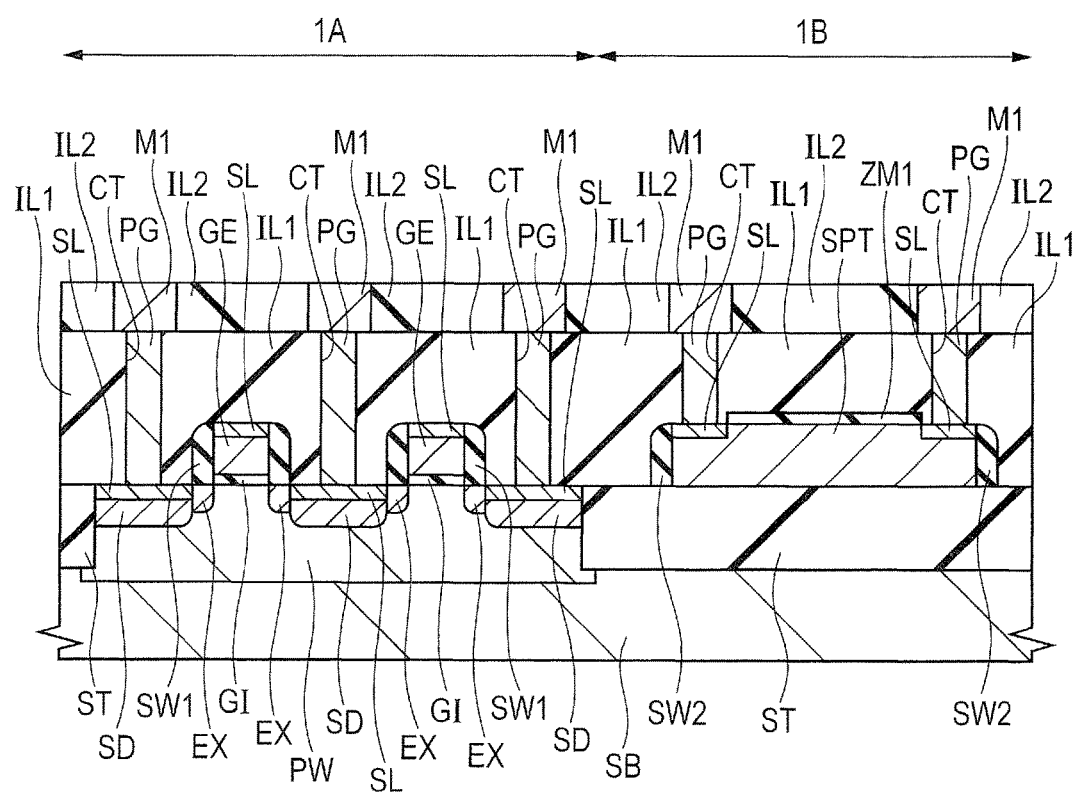
FIG. 24 is a fragmentary cross-sectional view of the semiconductor device during a manufacturing step following that of FIG. 23.

First, as shown in FIG. 24, an insulating film IL2 is formed on the interlayer insulating film IL1 filled with the plug PG. The insulating film IL2 may be a stacked film of a plurality of insulating films. Then, after formation of a wiring trench in a predetermined region of the insulating film 112 by dry etching with a photoresist pattern (not shown) as an etching mask, a barrier conductor film is formed on the insulating film IL2 and also on the bottom portion and side wall of the wiring trench. This barrier conductor film is made of, for example, a titanium nitride film, a tantalum film, a tantalum nitride film, or the like. A copper seed layer is then formed on the barrier conductor film by CVD, sputtering, or the like. Then, a copper plating film is formed on the seed layer by using electroplating to fill the wiring trench with the copper plating film. Then, the main conductor film (copper plating film and seed layer) and the barrier conductor film in a region other than the wiring trench are removed by CMP to form a first-layer wiring M1 using copper of the wiring trench as a main conductive material. To simplify the drawing, FIG. 24 shows the barrier conductor film, the seed layer, and the copper plating film as one film.

A second wiring and wirings thereabove are then formed by the dual damascene method or the like, but illustration and description of them is omitted here. The wiring M1 and wirings thereabove are not limited to a damascene wiring. They can also be formed by patterning a wiring conductor film. For example, they can be formed as a tungsten wiring or aluminum wiring.

The semiconductor device of First Embodiment is manufactured as described above.

Investigation Example

Figure 25:
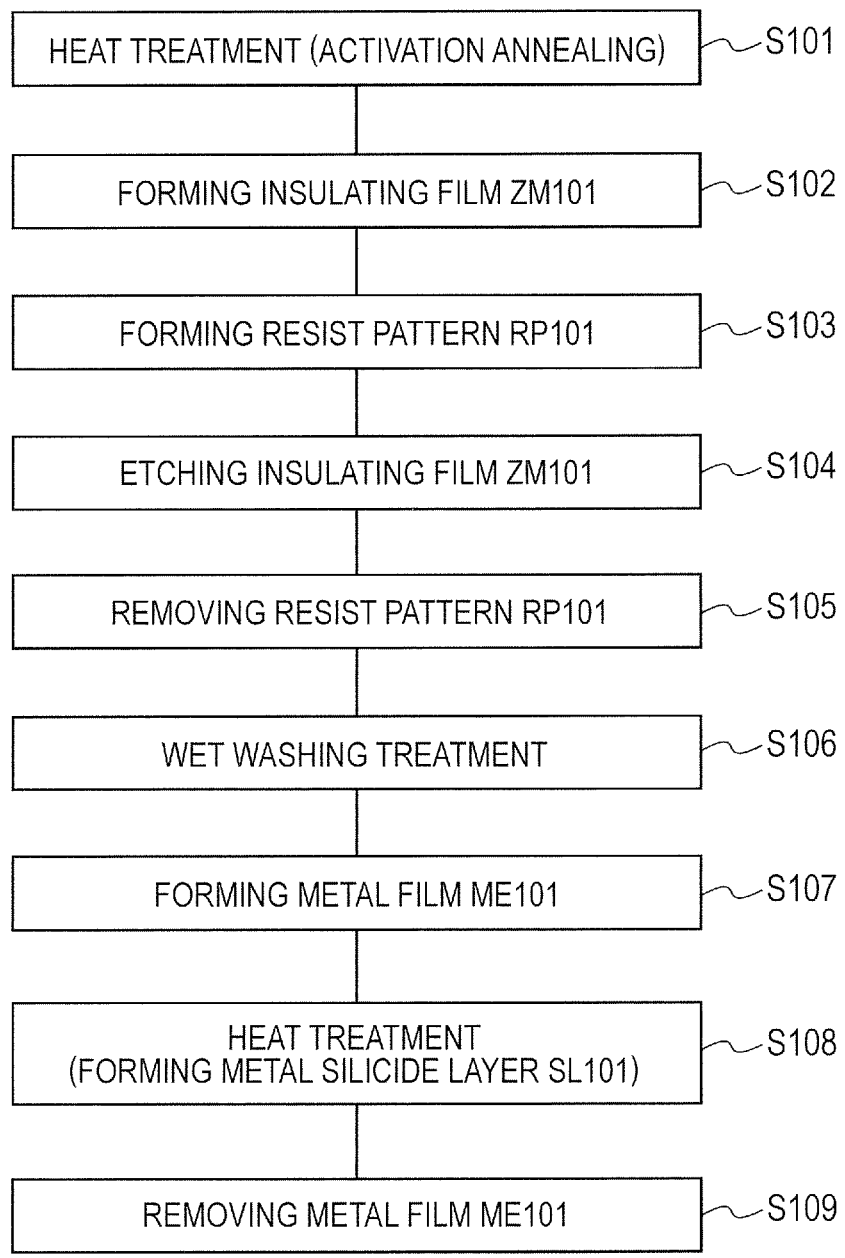
FIG. 25 is a process flow chart showing manufacturing steps of a semiconductor device of a first investigation example.

First investigation example investigated by the present inventors will be described referring to FIGS. 25 to 33. FIG. 25 is a process flow chart showing some manufacturing steps of a semiconductor device of First Investigation Example. FIGS. 26 to 33 are fragmentary cross-sectional views of the semiconductor device of First Investigation Example during the manufacturing steps thereof.

The manufacturing steps of the semiconductor device of First Investigation Example are almost similar to those of the semiconductor device of the above-described embodiment until Step S9, that is, a step of forming the n⁺ type semiconductor region SD by ion implantation. Steps after formation of the n⁺ type semiconductor region SD by the ion implantation of Step S9 will therefore be described.

Figure 26:
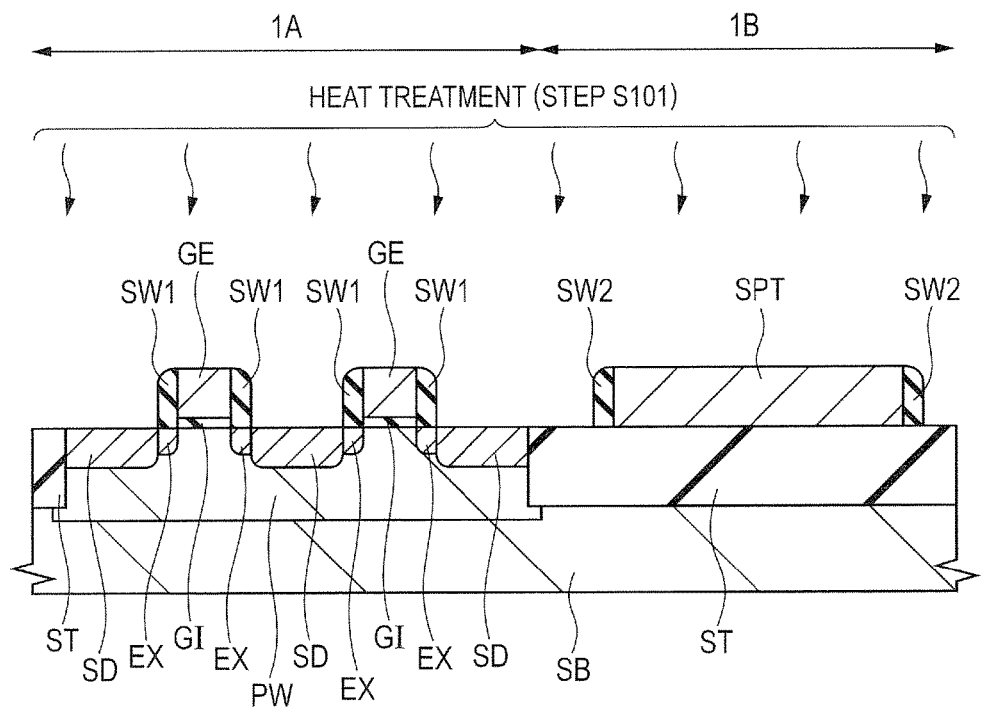
FIG. 26 is a fragmentary cross-sectional view of the semiconductor device of First Investigation Example during a manufacturing step thereof.

In First Investigation Example, after formation of the n⁺ type semiconductor region SD by the ion implantation of Step S9, the semiconductor substrate SB is subjected to heat treatment (activation annealing) to activate an impurity as shown in FIG. 26 (Step S101 in FIG. 25). The impurity introduced until then is activated by the heat treatment of Step S101.

Figure 27:
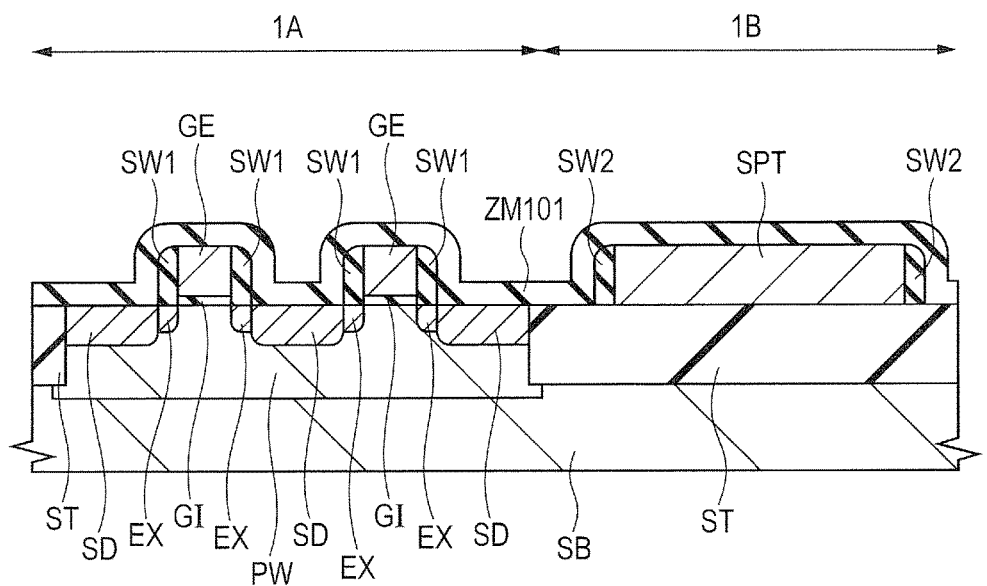
FIG. 27 is a fragmentary cross-sectional view of the semiconductor device during a manufacturing step following that of FIG. 26.

Next, as shown in FIG. 27, a silicide blocking insulating film (silicide block film) ZM101 is formed on the entire main surface of the semiconductor substrate SB so as to cover the gate electrode GE, the silicon pattern SPT, and the sidewall spacers SW1 and SW2 on the side surface of them (Step S102 in FIG. 25).

Figure 28:
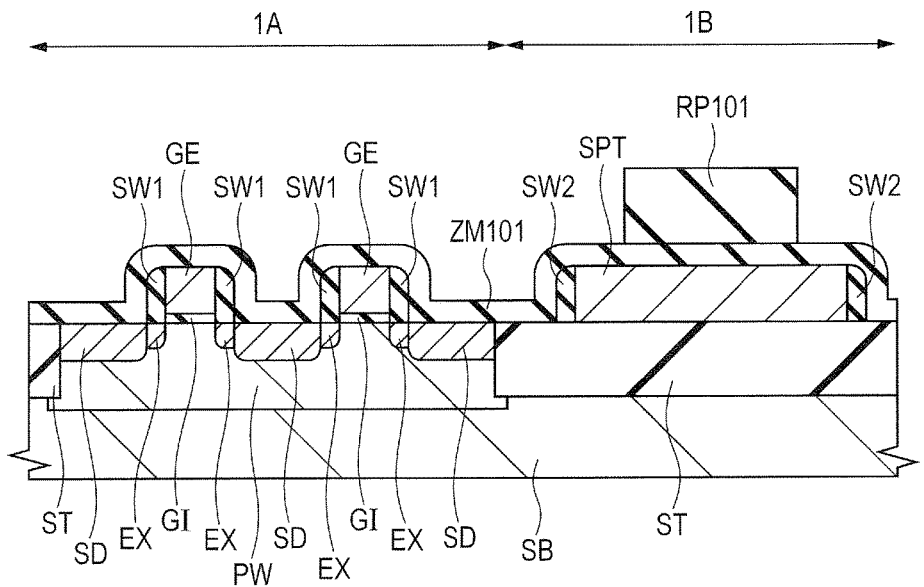
FIG. 28 is a fragmentary cross-sectional view of the semiconductor device during a manufacturing step following that of FIG. 27.

Next, as shown in FIG. 28, a resist pattern (photoresist pattern) RP101 is formed on the insulating film ZM101 by photolithography (Step S103 in FIG. 25). The resist pattern RP101 has a planar shape similar to that of the resist pattern RP1.

Figure 29:
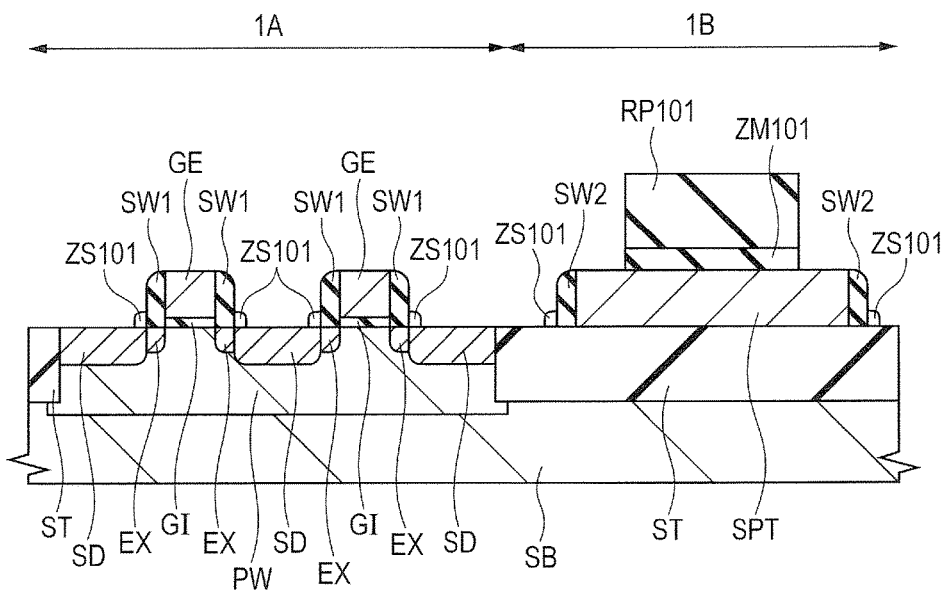
FIG. 29 is a fragmentary cross-sectional view of the semiconductor device during a manufacturing step following that of FIG. 28.

Next, as shown in FIG. 29, the insulating film ZM101 is etched with the resist pattern RP101 as an etching mask (Step S104 in FIG. 25).

By the etching of Step S104, a portion of the insulating film ZM101 exposed without being covered with the resist pattern RP101 is removed by etching, while a portion of the insulating film ZM101 covered with the resist pattern RP101 remains without being etched in Step S104.

When the etching step of Step S104 is performed, the upper surface of the gate electrode GE and the upper surface of the n⁺ type semiconductor region SD are exposed without being covered with the insulating film ZM101. When the etching step of Step S104 is performed, the upper surface of a region of the silicon pattern SPT where a metal silicide layer SL101 is formed is exposed without being covered with the insulating film ZM101. On the other hand, the upper surface of a region of the silicon pattern SPT where the metal silicide layer SL101 is not formed is not exposed and continues to be covered with the insulating film ZM101 even when the etching step of Step S104 is performed.

Figure 30:
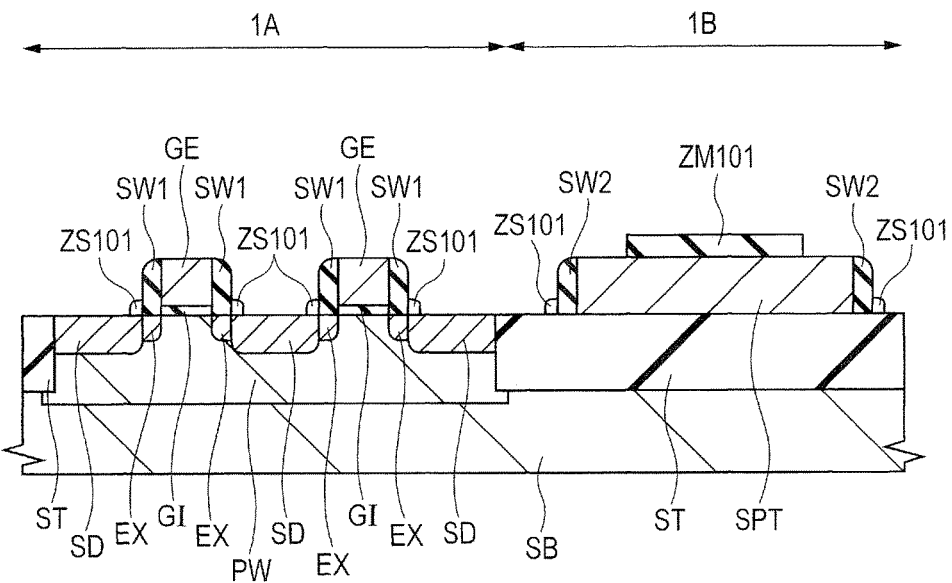
FIG. 30 is a fragmentary cross-sectional view of the semiconductor device during a manufacturing step following that of FIG. 29.

Next, as shown in FIG. 30, the resist pattern RP101 is removed using asking or the like (Step S105 in FIG. 25).

Figure 31:
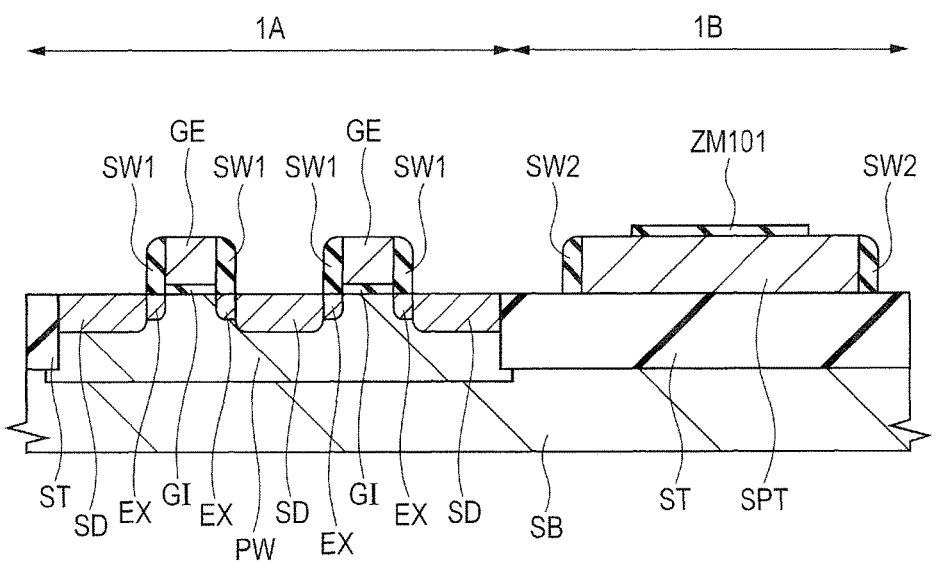
FIG. 31 is a fragmentary cross-sectional view of the semiconductor device during a manufacturing step following that of FIG. 30.

Next, wet washing treatment is performed (Step S106 in FIG. 25). FIG. 31 shows the state after the washing treatment of Step S106 is performed.

Figure 32:
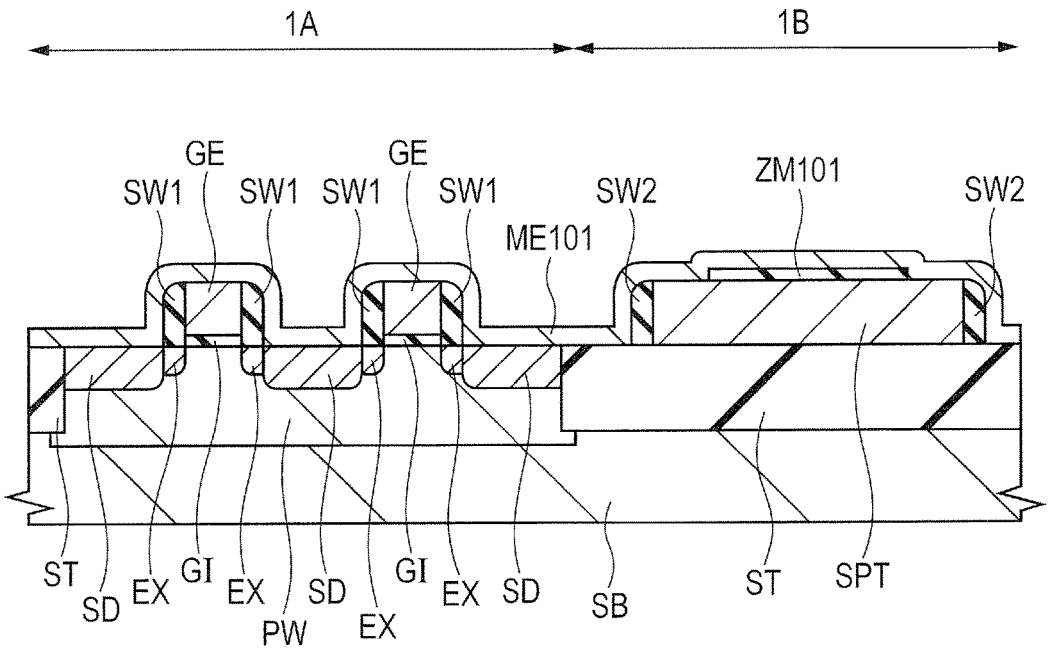
FIG. 32 is a fragmentary cross-sectional view of the semiconductor device during a manufacturing step following that of FIG. 31.

Next, as shown in FIG. 32, a metal film ME101 is formed on the entire main surface of the semiconductor substrate SB including the n⁺ type semiconductor region SD, the gate electrode GE, and the silicon pattern SPT (Step S107 in FIG. 25). The metal film ME101 is made of a material similar to that of the metal film ME.

Figure 33:
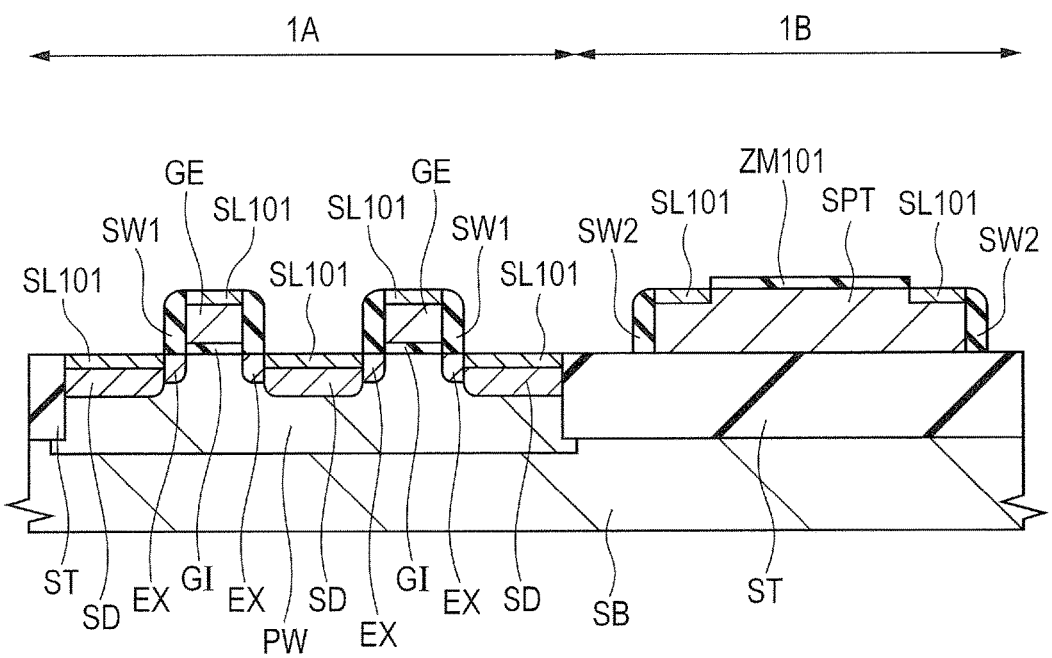
FIG. 33 is a fragmentary cross-sectional view of the semiconductor device during a manufacturing step following that of FIG. 32.

Next, the semiconductor substrate SB is subjected to heat treatment (annealing) (Step S108 in FIG. 25). This heat treatment of Step S108 causes, as shown in FIG. 33, reaction between the upper portion (upper layer portion) of each of the n⁺ type semiconductor region SD, the gate electrode GE, and the silicon pattern SPT and the metal film ME101 to form a metal silicide layer SL101.

Next, wet washing treatment (wet etching treatment) is performed to remove an unreacted portion of the metal film ME101 (that is, a portion of the metal film ME101 that has not reacted with the n⁺ type semiconductor region SD, the gate electrode GE, and the silicon pattern SPT in the heat treatment step of Step S108) (Step S109 in FIG. 25). FIG. 33 shows a stage after removal of the unreacted portion of the metal film ME101 by the wet washing treatment of Step S109. After removal of the unreacted portion of the metal film ME101 in Step S109, the semiconductor substrate SB is subjected to heat treatment (annealing treatment) further as needed to cause reaction between the metal silicide layer SL101 and the n⁺ type semiconductor region SD, the gate electrode GE, or the silicon pattern SPT that lies below the metal silicide layer.

In such a manner, the metal silicide layer SL101 is formed. This metal silicide layer SL101 is formed on the entire upper surface of the n⁺ type semiconductor region SD and on the entire upper surface of the gate electrode GE. The metal silicide layer SL101 is formed on a portion of the upper surface of the silicon pattern SPT not covered with the insulating film ZM101, while the metal silicide layer SL101 is not formed on a portion of the upper surface of the silicon pattern SPT covered with the insulating film ZM101.

Then, an interlayer insulating film corresponding to the interlayer insulating film IL1 is formed as in Step S21; a contact hole corresponding to the contact hole CT is formed as in Step S22; a plug corresponding to the plug PG is formed as in Step S23; and an insulating film and a wiring corresponding to the insulating film IL2 and the wiring M1, respectively, are formed as in Step S24, but they are not illustrated here.

In the manufacturing steps of First Investigation Example, prior to the formation of the silicide block film (here, the insulating film ZM101) in Step S102, heat treatment for activating the impurity is performed in Step S101. At the beginning of the heat treatment of Step S101, therefore, the insulating film ZM101 has not yet been formed and the upper surface of each of the n⁺ type semiconductor region SD, the gate electrode GE, and the silicon pattern SPT is exposed.

When the heat treatment of Step S101 is performed in First Investigation Example, an impurity introduced into each of the n⁺ type semiconductor region SD, the gate electrode GE, and the silicon pattern SPT may be released (emitted) from the exposed surface of the n⁺ type semiconductor region SD, the gate electrode GE, and the silicon pattern SPT. The heat treatment of Step S101 may therefore reduce the impurity concentration (impurity amount) in each of the n⁺ type semiconductor region SD, the gate electrode GE, and the silicon pattern SPT. It is difficult to control the release amount of the impurity, which has been introduced into each of the n⁺ type semiconductor region SD, the gate electrode GE, and the silicon pattern SPT, to the outside air from the exposed surface.

Even if the implantation conditions in the ion implantation step are controlled precisely and the impurity concentration in each of the n⁺ type semiconductor region SD, the gate electrode GE, and the silicon pattern SPT before the heat treatment of Step S101 can be adjusted to a desired value, the impurity concentration in each of the n⁺ type semiconductor region SD, the gate electrode GE, and the silicon pattern SPT after the heat treatment of Step S101 varies. This leads to variation in the impurity concentration in each of the n⁺ type semiconductor region SD, the gate electrode GE, and the silicon pattern SPT in the semiconductor device thus manufactured. As a result, the semiconductor device inevitably has variation in its electrical characteristics. Such a semiconductor device has deteriorated reliability so that prevention of it is desired.

Figure 34:
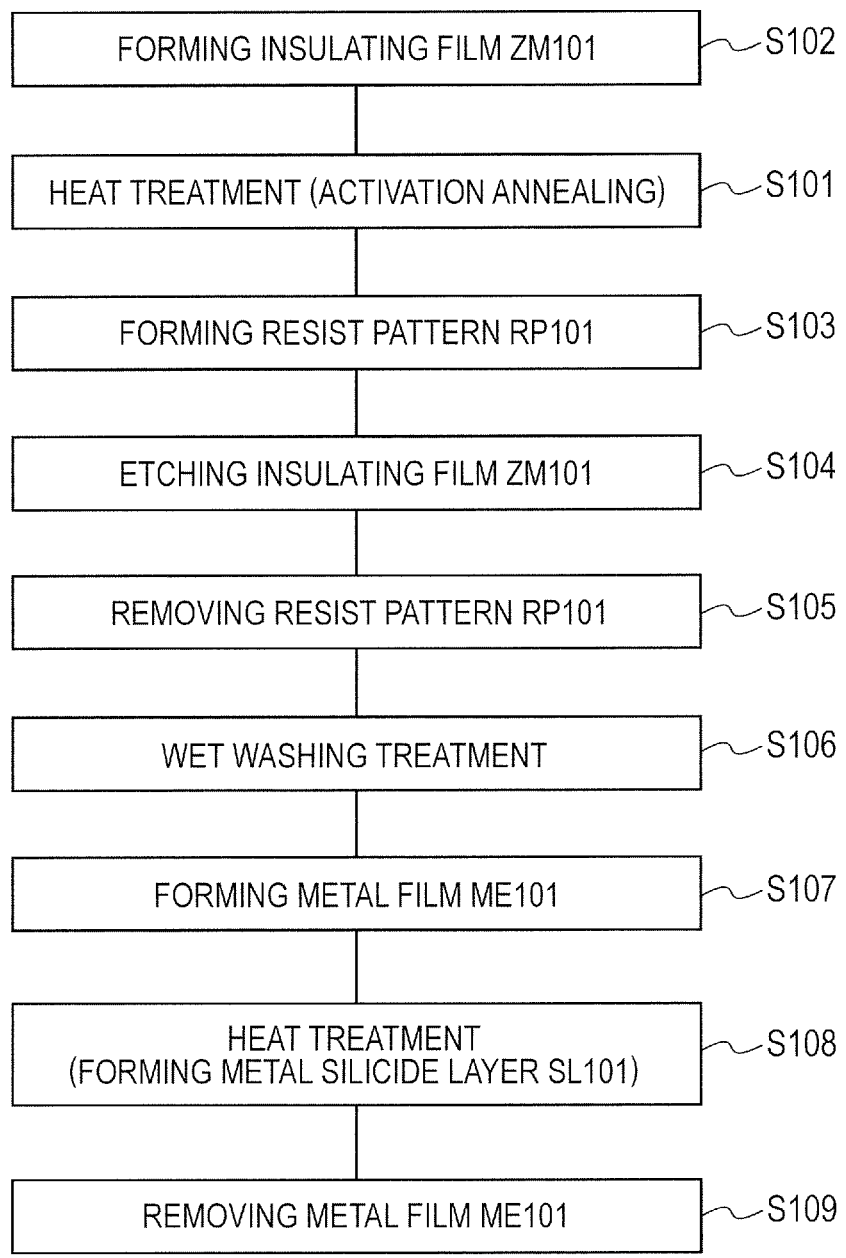
FIG. 34 is a process flow chart showing manufacturing steps of a semiconductor device of a second investigation example.
Figure 35:
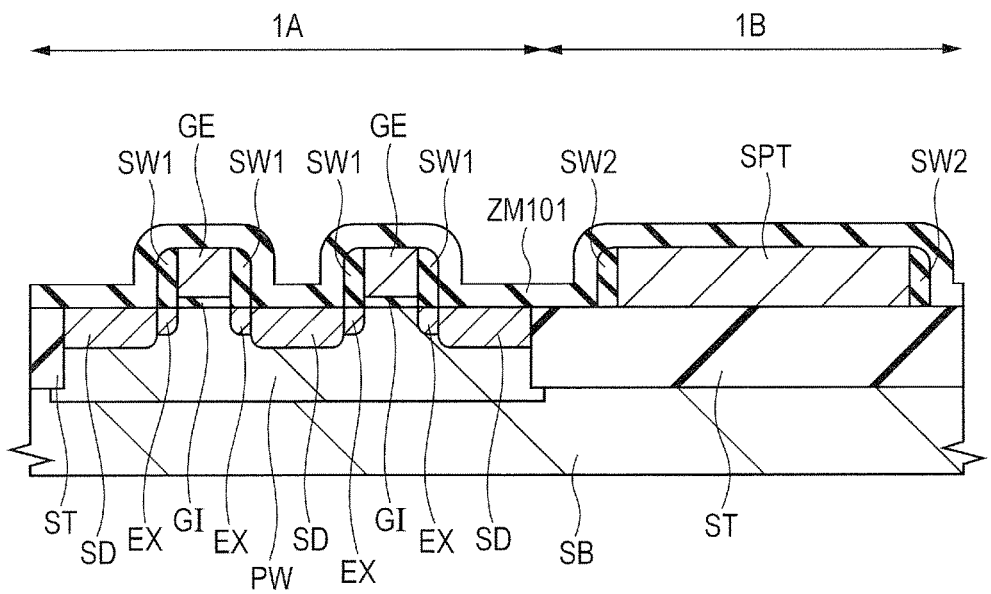
FIG. 35 is a fragmentary cross-sectional view of the semiconductor device of Second Investigation Example during a manufacturing step thereof.
Figure 36:
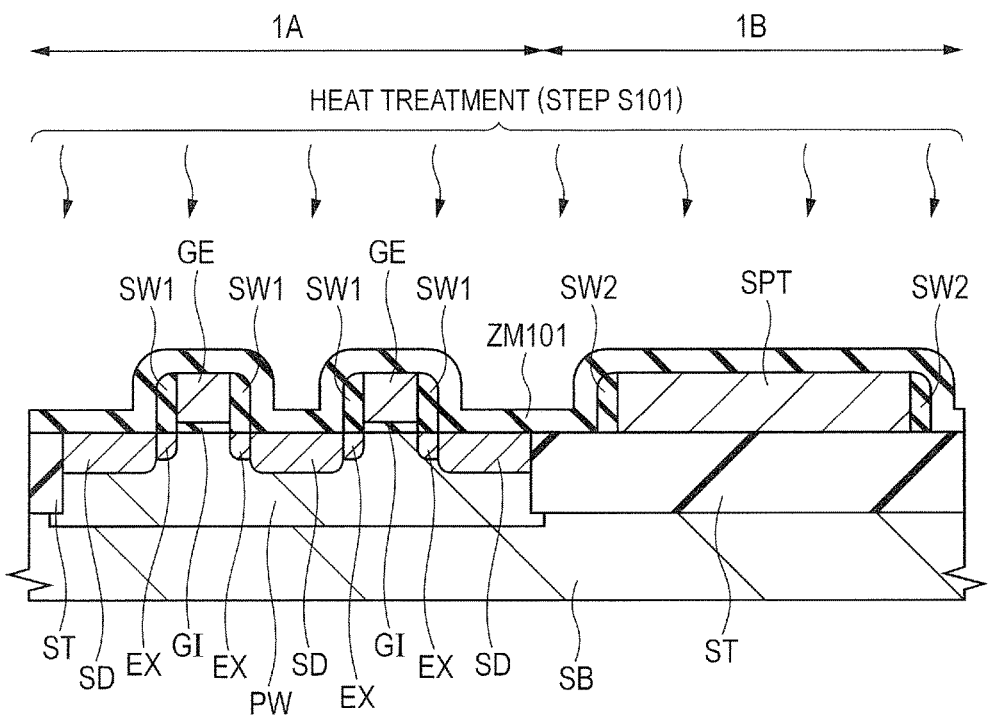
FIG. 36 is a fragmentary cross-sectional view of the semiconductor device during a manufacturing step following that of FIG. 35.

Next, Second Investigation Example investigated by the present inventors will be described referring to FIGS. 34 to 36. FIG. 34 is a process flow chart showing some manufacturing steps of a semiconductor device of Second Investigation Example. FIGS. 35 and 36 are fragmentary cross-sectional views of the semiconductor device of Second Investigation Example during the manufacturing steps thereof.

The manufacturing steps of the semiconductor device of Second Investigation Example correspond to the manufacturing steps of First Investigation Example except that the heat treatment step of Step S101 and the insulating film ZM101 formation step of Step S102 are changed in order. The manufacturing steps of the semiconductor device of Second Investigation Example will hereinafter be described specifically.

The manufacturing steps of the semiconductor device of Second Investigation Example are almost similar to those of the semiconductor device of the above-described embodiment until the formation of the $n^+$ type semiconductor region SD by the ion implantation of Step S9. Here, steps after formation of the $n^+$ type semiconductor region SD by the ion implantation of Step S9 will be described.

In Second Investigation Example, after formation of the $n^+$ type semiconductor region SD by the ion implantation of Step S9, a silicide blocking insulating film (silicide block film) ZM101 is formed on the entire main surface of the semiconductor substrate SB as shown in FIG. 35 so as to cover the gate electrode GE, the silicon pattern SPT, and the sidewall spacers SW1 and SW2 on the side wall of them (Step S102 in FIG. 34).

Next, as shown in FIG. 36, the semiconductor substrate SB is subjected to heat treatment (activation annealing) for impurity activation (Step S101 in FIG. 34). The impurities introduced until then are activated by the heat treatment of Step S101.

Steps of Second Investigation Example thereafter are similar to those of First Investigation Example.

Described briefly, in Second Investigation Example similar to First Investigation Example, a resist pattern RP101 is formed on the insulating film ZM101 in Step S103 as shown in FIG. 28 and the insulating film ZM101 is etched using the resist pattern RP101 as an etching mask in Step S104 as shown in FIG. 29. Then, As shown in FIG. 30, the resist pattern RP101 is removed in Step S105, wet washing treatment is performed in Step S106 as shown in FIG. 31, a metal film ME101 is formed in Step S107 as shown in FIG. 32; a metal silicide layer SL is formed by performing the heat treatment of Step S108 as shown in FIG. 33; and an unreacted portion of the metal film ME101 is removed by the wet washing treatment of Step S109. After removal of the unreacted portion of the metal film ME101 in Step S109, the semiconductor substrate SB may be subjected to heat treatment further as needed. Then, it is followed by Step S21 (interlayer insulating film IL1 formation step), Step S22 (contact hole CT formation step), Step S23 (plug PG formation step), and Step S24 (wiring M1 formation step).

The manufacturing steps of Second Investigation Example are similar to those of First Investigation Example except that the heat treatment step of Step S101 and the insulating film ZM101 formation step of Step S102 are changed in order.

In the manufacturing steps of Second Investigation Example, therefore, formation of the insulating film ZM101 in Step S102 is followed by the impurity activating heat treatment of Step S101. When the heat treatment of Step S101 is performed in Second Investigation Example, the insulating film ZM101 has already been formed so as to cover the $n^+$ type semiconductor region SD, the gate electrode GE, and the silicon pattern SPT. The upper surface of each of the $n^+$ type semiconductor region SD, the gate electrode GE, and the silicon pattern SPT is covered with the insulating film ZM101 so that it is not exposed.

In Second Investigation Example, even if the heat treatment of Step S101 is performed, the impurity introduced into each of the $n^+$ type semiconductor region SD, the gate electrode GE, and the silicon pattern SPT does not escape into the outside air. In other words, since the heat treatment of Step S101 is performed while covering the upper surface of each of the $n^+$ type semiconductor region SD, the gate electrode GE, and the silicon pattern SPT with the insulating film ZM101, escape of the impurity from each of the $n^+$ type semiconductor region SD, the gate electrode GE, and the silicon pattern SPT into the outside air at the time of the heat treatment of Step S101 can be prevented by the insulating film ZM101. In Second Investigation Example, therefore, the impurity concentration in each of the $n^+$ type semiconductor region SD, the gate electrode GE, and the silicon pattern SPT does not change between before and after the heat treatment of Step S101.

In Second investigation Example, variation in impurity concentration in each of the $n^+$ type semiconductor region SD, the gate electrode GE, and the silicon pattern SPT can be prevented. In the semiconductor device thus manufactured, therefore variation in impurity concentration in each of the $n^+$ type semiconductor region SD, the gate electrode GE, and the silicon pattern SPT can be prevented. The semiconductor device can therefore be suppressed or prevented from having variation in electrical characteristics attributable to variation in impurity concentration.

Figure 37:
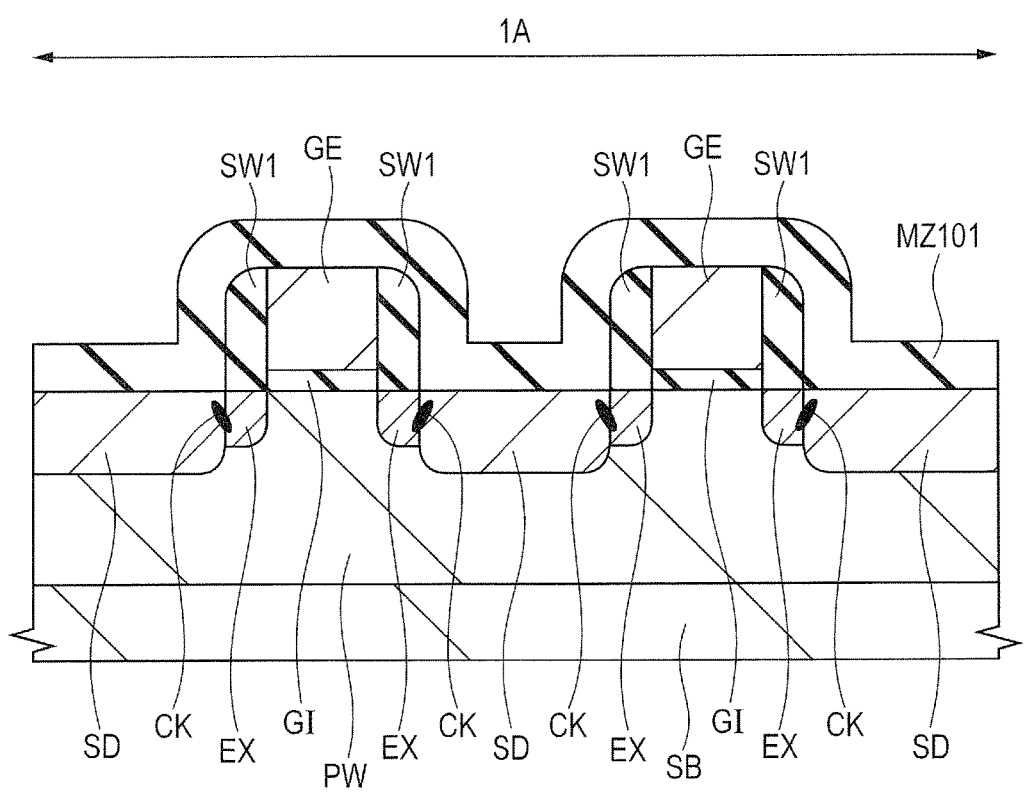
FIG. 37 is a fragmentary cross-sectional view of the semiconductor device of Second Investigation Example during a manufacturing step.

According to the investigation by the present inventors, however, problems as described below occur in the manufacturing steps of Second Investigation Example. FIG. 37 is a fragmentary cross-sectional view of the semiconductor device of Second Investigation Example during a manufacturing step thereof. It shows the stage after the heat treatment of Step S101. This means that FIG. 36 is partially enlarged into FIG. 37.

In the manufacturing steps of Second Investigation Example, the insulating film ZM101 is formed in Step S102 and then, the impurity activating heat treatment of Step S101 is performed. The insulating film ZM101 shrinks during the heat treatment of Step S101. Due to a stress caused by the shrinkage of the insulating film ZM101, a strain occurs in the semiconductor substrate SB and crystal defects CK are likely to appear in the semiconductor substrate SB. In other words, since the heat treatment of Step S101 is high-temperature heat treatment, a shrinkage amount of the insulating film ZM101 becomes large at the time of the heat treatment of Step S101, a strain occurs in the semiconductor substrate SB due to a stress caused by the shrinkage, and the semiconductor substrate SB is likely to have crystal defects CK therein. FIG. 37 schematically shows the crystal defects CK caused by the heat treatment of Step S101. The crystal defects CK are likely to be formed at a stress concentrated position, for example, in a substrate region below the side surface of the sidewall spacer SW1 (the side surface on the side opposite to the side contiguous to the gate electrode GE). In short, the crystal defects CK are likely to appear in the vicinity of the boundary between the $n^+$ type semiconductor region SD and the $n^-$ type semiconductor region EX. The crystal defects CK are sometimes cracks.

The substrate region into which an impurity has been ion-implanted in Steps S7 and S9 (more specifically, region having therein the n⁻ type semiconductor region EX and the n⁺ type semiconductor region SD) are amorphous before the heat treatment of Step S101. This is also one of factors facilitating generation of crystal defects CK at a position shown in FIG. 37 at the time of the heat treatment of Step S101.

When the crystal defects CK are formed in the semiconductor substrate SB, the semiconductor device thus manufactured may then have deteriorated reliability due to variation in electrical characteristics. It is therefore desired to prevent generation of the crystal defects in the semiconductor substrate SB which will otherwise occur due to a stress caused by shrinkage of the insulating film M101.

To prevent the crystal defects CK in the semiconductor substrate SB, the heat treatment of Step S101 prior to the insulating film ZM101 formation step (Step S102) as in First Investigation Example is required. The high-temperature heat treatment as in Step S101 before formation of the insulating film ZM101 makes it possible to prevent generation of the crystal defects CK in the semiconductor substrate SB which will otherwise occur due to a stress caused by shrinkage of the insulating film ZM101, because the insulating film ZM101 is not exposed to such high-temperature heat treatment.

First Investigation Example is, however, accompanied with the drawback that as described above, the impurity introduced into each of the n⁺ type semiconductor region SD, the gate electrode GE, and the silicon pattern SPT escapes into the outside air (is emitted) during the heat treatment of Step S101 when the heat treatment of Step S101 is performed before the insulating film ZM101 formation step (Step S102).

First Investigation Example and Second Investigation Example therefore inevitably have respectively different problems.

In order to suppress generation of the crystal defects CK in the semiconductor substrate SB due to a stress caused by the shrinkage of the insulating film ZM101 in Second Investigation Example, thinning of the insulating film ZM101 to be formed in Step S102 is thought as a solution. The stress caused by the shrinkage of the insulating film ZM101 during the heat treatment of Step S101 tends to increase with an increase in the thickness of the insulating film ZM101 and tends to decrease with a decrease in the thickness of the insulating film ZM101. A decrease in the thickness of the insulating film ZM101 to be formed in Step S102 can therefore decrease a stress caused by the shrinkage of the insulating film ZM101 and can thereby suppress or prevent generation of the crystal defects CK in the semiconductor substrate SB due to the shrinkage of the insulating film ZM101.

Thinning of the insulating film ZM101 to be formed in Step S102 in Second Investigation Example may cause another problem. When the thickness of the insulating film ZM101 to be formed in Step S102 is reduced in Second Investigation Example, the insulating film ZM101 expected to function as a silicide block film during the wet washing treatment of Step S106 may disappear by etching.

The wet washing treatment of Step S106 has the following role. When the etching of Step S104 is finished, a residual portion (remaining portion) ZS101 of the insulating film ZM101 sometimes remains at a position adjacent to the lower portion of the side surface of the sidewall spacer SW1 on the side wall of the gate electrode GE (the lower portion of the side surface of the sidewall spacer on the side opposite to a side adjacent to the gate electrode GE). This residual portion ZS101 is shown in FIGS. 29 and 30. When Steps S107, S108, and S109 are performed without removing this residual portion ZS101, the metal silicide layer SL101 is not formed on the surface of a portion of the n⁺ type semiconductor region SD covered with this residual portion ZS101. However, even if the residual portion ZS101 appears during the etching step of Step S104, this residual portion ZS101 can be removed by etching in the wet washing treatment of Step S106. Occurrence of a formation failure of the metal silicide layer SL101 due to the presence of the residual portion ZS101 can therefore be suppressed or prevented.

The resist pattern RP101 is removed in Step S105, but the resist pattern RP101 cannot be removed completely and a residue of the resist pattern RP101 may remain. Even when the residue of the resist pattern RP101 appears in the resist pattern RP101 removing step of Step S105, however, the residue of the resist pattern RP101 can be removed by the wet washing treatment of Step S106. Occurrence of a formation failure of the metal silicide layer SL101 due to the residue of the resist pattern RP101 can therefore be suppressed or prevented.

In addition, by the washing treatment of Step S106, a surface on which the metal silicide layer SL101 is to be formed (meaning the surface of the n⁺ type semiconductor region SD, the surface of the gate electrode GE, and the surface of a portion of the silicon pattern SPT not covered with the insulating film ZM101) can be cleaned and exposed precisely. The metal silicide layer SL101 can therefore be formed precisely in a predetermined region.

Since the wet washing treatment of Step S106 has such an effect, the wet washing treatment of Step S106 may inevitably etch the insulating film ZM101 to some extent. Described specifically, the insulating film ZM101 is inevitably etched to some extent during the wet washing treatment of Step S106 when a chemical solution or treatment time is selected for the purpose of precisely removing the residual portion ZS101 of the insulating film ZM101 or the residue of the resist pattern RP101 by the wet washing treatment of Step S106, and cleaning and precisely exposing the surface on which the metal silicide layer SL101 is to be formed. This means that the insulating film ZM101 after the wet washing treatment of Step S106 becomes thinner and the thickness of the insulating film ZM101 after the wet washing treatment of Step S106 becomes smaller than that of the insulating film ZM101 before the wet washing treatment of Step S106.

When the insulating film ZM101 to be formed in Step S102 is thin, the insulating film ZM101 required to function as a silicide block film is inevitably removed by etching during the wet washing treatment of Step S106. The insulating film ZM101 which is a silicide block film may disappear from a region where the formation of the metal silicide layer SL101 should be prevented. It is therefore desired not to considerably decrease the thickness of the insulating film ZM101 to be formed in Step S102 but to maintain a certain level of thickness so as to leave, after the wet washing treatment of Step S106, the insulating film ZM101 in layer form in a region where the formation of the metal silicide layer SL101 should be prevented. Then, the insulating film ZM101 can be left precisely, after the wet washing treatment of Step S106, in a region where the formation of the metal silicide layer SL101 should be prevented, making it possible to prevent formation of the metal silicide layer SL101 in a region covered with the insulating film ZM101.

This means that in Second Investigation Example, when the insulating film ZM101 to be formed in Step S102 is a thin film, the insulating film ZM101 required to function as a silicide block film may disappear by the wet washing treatment of Step S106, while when the insulating film ZM101 to be formed in Step S102 is a thick film, crystal defects CK are likely to appear in the semiconductor substrate SB during the heat treatment of Step S101.

Thus, in Second Investigation Example, whether the insulating film ZM101 to be formed in Step S102 is thick or thin, respectively different problems may inevitably occur.
<Main Characteristics and Advantages>

The following are details of the manufacturing steps of the semiconductor device of First Embodiment. In Step S1, a semiconductor substrate SB is provided. In Steps S4, S5, and S6, a gate electrode GE for MISFET is formed on the semiconductor substrate SB via a gate insulating film (here, insulating film GI). Then, a sidewall spacer SW (sidewall insulating film) is formed on the side wall of the gate electrode in Step S8 and an $n^+$ type semiconductor region SD (source/drain region) is formed in the semiconductor substrate SB by the ion implantation of Step S9. Then, in Step S10, an insulating film ZM1 (first insulating film) is formed on the semiconductor substrate SB so as to cover the gate electrode GE and the sidewall spacer SW. In Step S11, heat treatment (first heat treatment) is performed. An insulating film ZM2 (second insulating film) is formed on the insulating film ZM1 in Step S12. A resist pattern RP1 is formed on the insulating film ZM2 in Step S14. Then, with the resist pattern RP1 as an etching mask, the insulating film ZM2 and the insulating film ZM1 are etched in Step S15 to remove a portion of the insulating film ZM2 and the insulating film ZM1 not covered with the resist pattern RP1 and leave the insulating film ZM2 and the insulating film ZM1 below the resist pattern RP1. The resist pattern RP1 is then removed in Step S16, followed by the wet washing treatment of Step S17. A metal film ME is then formed on the semiconductor substrate SB including the $n^+$ type semiconductor region SD (source/drain region) so as to cover the gate electrode GE and the sidewall spacer SW in Step S18. Heat treatment (second heat treatment) is then performed in Step S19 to cause reaction between the metal film ME and the $n^+$ type semiconductor region SD (source/drain region) to form a metal silicide layer SL on the $n^+$ type semiconductor region SD (source and drain regions).

One of the main characteristics of First Embodiment is that the insulating film ZM1 is formed in Step S10, heat treatment is performed in Step S11, and the insulating film ZM2 is formed on the insulating film ZM1 in Step S12.

In First Embodiment, a stacked film of the insulating film ZM1 and the insulating film ZM2 formed on the insulating film ZM1 is used instead of the insulating film ZM101 and at the same time, the heat treatment step of Step S11 is performed after the insulating film ZM1 formation step (Step S10) but before the insulating film ZM2 formation step (Step S12).

In First Embodiment, formation of the insulating film ZM1 in Step S10 is followed by the heat treatment of Step S11 so that the insulating film ZM1 has already covered the $n^+$ type semiconductor region SD, the gate electrode GE, and the silicon pattern SPT when the heat treatment of Step S11 is performed. This means that the upper surface of each of the $n^+$ type semiconductor region SD, the gate electrode GE, and the silicon pattern SPT is not exposed.

Even if the heat treatment of Step S11 is performed, the impurity introduced into each of the $n^+$ type semiconductor region SD, the gate electrode GE, and the silicon pattern SPT does not therefore escape into the outside air. This means that since the heat treatment of Step S11 is performed, while covering the upper surface of each of the $n^+$ type semiconductor region SD, the gate electrode GE, and the silicon pattern SPT with the insulating film ZM1, the insulating film ZM1 can prevent the impurity from escaping from each of the $n^+$ type semiconductor region SD, the gate electrode GE, and the silicon pattern SPT into the outside air during the heat treatment of Step S11. In First Embodiment, therefore, the impurity concentration in each of the $n^+$ type semiconductor region SD, the gate electrode GE, and the silicon pattern SPT can be maintained between before and after the heat treatment of Step S11.

In First Embodiment, variation in impurity concentration in each of the $n^+$ type semiconductor region SD, the gate electrode GE, and the silicon pattern SPT after the heat treatment of Step S11 can therefore be prevented. The semiconductor device thus manufactured can prevent variation in impurity concentration in each of the $n^+$ type semiconductor region SD, the gate electrode GE, and the silicon pattern SPT. This therefore makes it possible to suppress or prevent variation in electrical characteristics of a semiconductor device due to variation in impurity concentration. As a result, the semiconductor device thus manufactured can have improved reliability.

When different from First Embodiment, the heat treatment of Step S11 is followed by the insulating film ZM1 formation step (Step S10), the problem as described referring to First Investigation Example occurs. In First Embodiment, the problem as described referring to First Investigation Example can be overcome by carrying out the heat treatment of Step S11 after the insulating film ZM1 formation step (Step S10).

In addition, in First Embodiment, the insulating film ZM101 is replaced by a stacked film of the insulating film ZM1 and the insulating film ZM2 on the insulating film ZM1 and at the same time, the heat treatment step of Step S11 is performed after the insulating film ZM1 formation step (Step S10) but before the insulating film ZM2 formation step (Step S12). When the thickness of the insulating film ZM101 formed in Step S102 in Second Investigation Example is made equal to a total thickness of the insulating films ZM1 and ZM2 formed in Steps S10 and S12 in First Embodiment, the thickness of the insulating film ZM1 during the heat treatment of Step S11 in First Embodiment becomes smaller than that of the insulating film ZM101 during the heat treatment of Step S101 in Second Investigation Example. This means that in Second Investigation Example, the heat treatment of Step S101 is performed while having the thick insulating film ZM101, while in First Embodiment, the heat treatment of Step S11 is performed while having the insulating film ZM1 thinner than the insulating film ZM101. Compared with the stress caused by shrinkage of the insulating film ZM101 during the heat treatment of Step S101 in Second Investigation Example, the stress caused by the shrinkage of the insulating film ZM1 during the heat treatment of Step S11 in First Embodiment becomes small. In First Embodiment, compared with Second Investigation Example, generation of crystal defects (CK) in the semiconductor substrate SB due to the shrinkage of the insulating film (insulating film ZM101 or insulating film ZM1) during heat treatment (the heat treatment of Step S101 or Step S11) can therefore be suppressed or prevented.

In addition, in First Embodiment, after formation of the insulating film ZM1 in Step S10 and heat treatment in Step S11, the insulating film ZM2 is formed on the insulating film ZM1 in Step S12 and then the stacked film of the insulating film ZM1 and the insulating film ZM2 is patterned in Steps S14 and S15. So, even if the insulating film ZM1 formed in Step S10 is thin in First Embodiment, the thickness can be increased to some extent by forming the insulating film ZM2 on the insulating film ZM1 in Step S12 and thereby securing the thickness by the stacked film of the insulating film ZM1 and the insulating film ZM2. For example, the total thickness of the insulating films ZM1 and ZM2 formed in Steps S10 and S12 can be made almost equal to the thickness of the insulating film ZM101 formed in Step S102 in Second Investigation Example, while making the thickness of the insulating film ZM1 formed in Step S10 thinner than the thickness of the insulating film ZM101 formed in Step S102 in Second Investigation Example.

In consideration of the effect of the wet washing treatment of Step S17, the stacked film of the insulating film ZM1 and the insulating film ZM2 is inevitably etched to some extent during the wet washing treatment of Step S17. In other words, in order to precisely remove the residual portion ZS of the insulating films ZM1 and ZM2 or the residue of the resist pattern RP1 by the wet washing treatment of Step S17, clean the surface on which the metal silicide layer SL is to be formed, and thereby expose it precisely, the stacked film of the insulating film ZM1 and the insulating film ZM2 is inevitably etched to some extent during the wet washing treatment of Step S17.

In First Embodiment, however, even if the insulating film ZM1 formed in Step S10 is thin, the insulating film ZM2 is formed on the insulating film ZM1 in Step S12 so that the stacked film of the insulating film ZM1 and the insulating film ZM2 can have a certain level of thickness. Even by the wet washing treatment of Step S17, the insulating film ZM1 can be left in layer form in a region where the formation of the metal silicide layer SL should be prevented. The metal film ME can be formed in Step S18 while leaving the insulating film ZM1 in layer form in a region where the formation of the metal silicide layer SL should be prevented so that the formation of the metal silicide layer SL in the region covered with the insulating film ZM1 can be prevented completely.

In First Embodiment, as described above, the silicide block film during patterning in Steps S14 and S15 has a certain thickness in consideration of a decrease in the thickness of the silicide block film in the wet washing treatment of Step S17 and at the same time, in order to suppress a stress generated during the heat treatment of Step S11, the silicide block film during the heat treatment of Step S11 is thinned. To actualize such a thickness, in First Embodiment, the stacked film of the insulating film ZM1 and the insulating film ZM2 on the insulating film ZM1 is used as the silicide block film and the heat treatment step of Step S11 is performed after the insulating film ZM1 formation step (Step S10) but before the insulating film ZM2 formation step (Step S12). By carrying out the heat treatment of Step S11 while having the silicide block film (here, the insulating film ZM1), escape of the impurity from the n$^+$ type semiconductor region SD and the like into the outside air during the heat treatment of Step S11 can be prevented. In addition, since the thickness of the silicide block film (here, the insulating film ZM1) during the heat treatment of Step S11 can be reduced, formation of the crystal defects (CK) in the semiconductor substrate SB due to a stress caused by the shrinkage of the silicide block film (here, the insulating film ZM1) can be suppressed or prevented. Further, the thickness of the silicide block film (here, the stacked film of the insulating film ZM1 and the insulating film ZM2) during patterning in Steps S14 and S15 can be made greater than that of the silicide block film (here, the insulating film ZM1) during the heat treatment of Step S11. Even when the thickness of the silicide block film decreases by the wet washing treatment of Step S17, the silicide block film (here, the insulating film ZM1) can be left in layer form in the region where the formation of the metal silicide layer SL should be prevented. This makes it possible to completely prevent formation of the metal silicide layer SL in the region covered with the remaining silicide block film (here, the insulating film ZM1).

In First Embodiment, the stacked film of the insulating film ZM1 and the insulating film ZM2 is used as the silicide block film. Not only it but also carrying out the heat treatment step of Step S11 after the insulating film ZM1 formation step (Step S10) and before the insulating film ZM2 formation step (Step S12) is important. Described specifically, different from First Embodiment, when both the insulating film ZM1 formation step (Step S10) and the insulating film ZM2 formation step (Step S12) are performed after the heat treatment step of Step S11, the problem (escape of the impurity from the n$^+$ type semiconductor region SD and the like into the outside air by the heat treatment) as described in First Investigation Example inevitably occurs. When both the insulating film ZM1 formation step (Step S10) and the insulating film ZM2 formation step (Step S12) are performed before the heat treatment step of Step S11, the problem (generation of crystal defects in the semiconductor substrate SB due to a stress caused by shrinkage of the insulating films ZM1 and ZM2 during the heat treatment of Step S11) as described in Second Investigation Example inevitably occurs.

In First Embodiment, the heat treatment step of Step S11 is performed after the insulating film ZM1 formation step (Step S10) but before the insulating film ZM2 formation step (Step S12) so that both the problem as described in First Investigation Example and the problem as described in Second Investigation Example can be overcome. Described specifically, in First Embodiment, after the insulating film ZM1 formation step (Step S10), the heat treatment step of Step S11 is performed. This means that the heat treatment step of Step S11 is performed after formation of the insulating film ZM1 so that the problem (escape of the impurity from the n$^+$ type semiconductor region SD and the like into the outside air by the heat treatment) as described in First Investigation Example can be overcome. In addition, in First Embodiment, before the insulating film ZM2 formation step (Step S12), the heat treatment step of Step S11 is performed. The heat treatment step of Step S11 is performed after formation of the insulating film ZM1 but before formation of the insulating film ZM2 so that the problem (generation of crystal defects in the semiconductor substrate SB due to a stress caused by shrinkage of the insulating films ZM1 and ZM2 during the heat treatment of Step S11) as described in Second Investigation Example can be overcome.

Thus, in First Embodiment, the problem described in First Investigation Example or the problem described in Second Investigation Example can be overcome by forming the insulating film ZM1 in Step S10, carrying out heat treatment in Step S11, and forming the insulating film ZM2 on the insulating film ZM1 in Step S12. The semiconductor device thus manufactured can have improved reliability.

Next, another characteristic of First Embodiment will be described.

In First Embodiment, it is preferred not to carry out heat treatment (heating step) at a temperature not less than the heat treatment temperature (first heat treatment temperature) of Step S11 after Step S9 (n$^+$ type semiconductor region SD formation step) but before Step S10 (the insulating film ZM1 formation step). For example, when the heat treatment temperature of Step S11 is 1000° C., heat treatment at a temperatures not less than 1000° C. is not performed after Step S9 ($n^+$ type semiconductor region SD formation step) but before Step S10 (insulating film ZM1 formation step).

In contrast to First Embodiment, when heat treatment at a temperature not less than the heat treatment temperature of Step S11 is performed after Step S9 ($n^+$ type semiconductor region SD formation step) but before Step S10 (insulating film ZM1 formation step), a phenomenon that impurities introduced into the $n^+$ type semiconductor region SD and the like escape into the outside air may occur during heat treatment.

In First Embodiment, on the other hand, by preventing heat treatment at a temperature not less than the heat treatment temperature of Step S11 after Step S9 ($n^+$ type semiconductor region SD formation step) but before Step S10 (insulating film ZM1 formation step), it is possible to prevent high-temperature heat treatment (heat treatment at a temperature not less than the heat treatment temperature of Step S11) while exposing the $n^+$ type semiconductor region SD. This makes it possible to effectively suppress or prevent occurrence of the phenomenon that impurities introduced into the $n^+$ type semiconductor region SD and the like escape into the outside air by the high-temperature heat treatment. In addition, by performing the high-temperature heat treatment (activation annealing) required to be performed after Step S9 ($n^+$ type semiconductor region SD formation step) as the heat treatment of Step S11 after Step S10 (insulating film ZM1 formation step), occurrence of the phenomenon that impurities introduced into the $n^+$ type semiconductor region SD and the like escape into the outside air by the high-temperature heat treatment can be prevented by this insulating film ZM1.

In First Embodiment, it is preferred not to carry out heat treatment (heating step) at a temperature not less than the heat treatment temperature (first heat treatment temperature) of Step S11 after Step S12 (insulating film ZM2 formation step) but before Step S15 (step of etching the insulating films ZM2 and ZM1). For example, when the heat treatment temperature of Step S11 is 1000° C., heat treatment at a temperature not less than 1000° C. is not performed after Step S12 (insulating film ZM2 formation step) but before Step S15 (step of etching the insulating films ZM2 and ZM1).

When different from First Embodiment, heat treatment at a temperature not less than the heat treatment temperature of Step S11 is performed after Step S12 (insulating film ZM2 formation step) but before Step S15 (step of etching the insulating films ZM2 and ZM1), crystal defects may be generated in the semiconductor substrate SB due to a stress caused by shrinkage of the stacked film of the insulating film ZM1 and the insulating film ZM2 during this heat treatment.

In First Embodiment, on the other hand, it is possible to prevent the high-temperature heat treatment (heat treatment at a temperature not less than the heat treatment temperature of Step S11) from being performed while having the stacked film of the insulating film ZM1 and the insulating film ZM2 on the entire main surface of the semiconductor substrate SB by not carrying out heat treatment at a temperature not less than the heat treatment temperature of Step S11 after Step S12 but before Step S15. This makes it possible to effectively suppress or prevent generation of crystal defects in the semiconductor substrate due to a stress caused by shrinkage of the stacked film of the insulating film ZM1 and the insulating film ZM2 during heat treatment. In addition, by carrying out the high-temperature heat treatment (activation annealing) required to be carried out after Step S9 ($n^+$ type semiconductor region SD formation step) as the heat treatment of Step S11 before Step S12 (insulating film ZM2 formation step), the high-temperature heat treatment can be carried out while having the insulating film ZM1 but not having the insulating film ZM2. During heat treatment of Step S11, therefore, the thickness of the insulating film (here, the insulating film ZM1) formed on the entire main surface of the semiconductor substrate SB can be reduced and thereby generation of crystal defects in the semiconductor substrate SB due to a stress caused by shrinkage of the insulating film (here, the insulating film ZM1) can be suppressed or prevented.

By the heat treatment of Step S11, the impurity in the $n^+$ type semiconductor region SD (source/drain region) formed in Step S9 can be activated. Also the impurity in the $n^-$ type semiconductor region EX, the gate electrode GE, and the silicon pattern SPT can be activated by the heat treatment of Step S11. Therefore, the heat treatment of Step S11 can also be regarded as activation annealing (heat treatment for activating impurities). Relatively high temperature heat treatment is necessary as activation annealing. The heat treatment of Step S11 is therefore relatively high temperature heat treatment. The heat treatment temperature (first heat treatment temperature) of Step S11 is preferably 900° C. or more. By setting the heat treatment temperature of Step S11 at 900° C. or more, the impurity introduced into the $n^+$ type semiconductor region SD or the like can be activated effectively. In addition, the substrate region which has been made amorphous by ion implantation can be crystallized by the heat treatment of Step S11. For example, a temperature of from about 900 to 1050° C. is suited as the heat treatment temperature of Step S11.

The high-temperature heat treatment is necessary as activation annealing but it may cause the problem described in First Investigation Example or the problem described in Second Investigation Example. In First Embodiment, the above-described problems can be solved by performing activation annealing between Step S10 and Step S12 as described above.

More specifically, after the heat treatment of Step S11, heat treatment (heating step) at a temperature not less than the heat treatment temperature (first heat treatment temperature) of Step S11 is not performed. This means that in Step after Step S9 (the $n^+$ type semiconductor region SD formation step), the heat treatment of Step S11 is a step performed at the highest temperature. In Step after Step S9 (the $n^+$ type semiconductor region SD formation step), by carrying out the heat treatment of Step S11, that is, the highest temperature step, after the insulating film ZM1 formation step (Step S10) and at the same time before the insulating film ZM2 formation step (Step S12), the problem as described in First Investigation Example or the problem as described in Second Investigation Example can be solved.

In First Embodiment, the heat treatment of Step S13 is performed after Step S12 (the insulating film ZM2 formation step) but before Step S14 (the resist pattern RP1 formation step). The heat treatment temperature (second heat treatment temperature) of Step S13 is lower than the heat treatment temperature (first heat treatment temperature) of Step S11. The heat treatment of Step S13 can be omitted, but the heat treatment of Step S13 can produce the following advantage.

Figure 38:
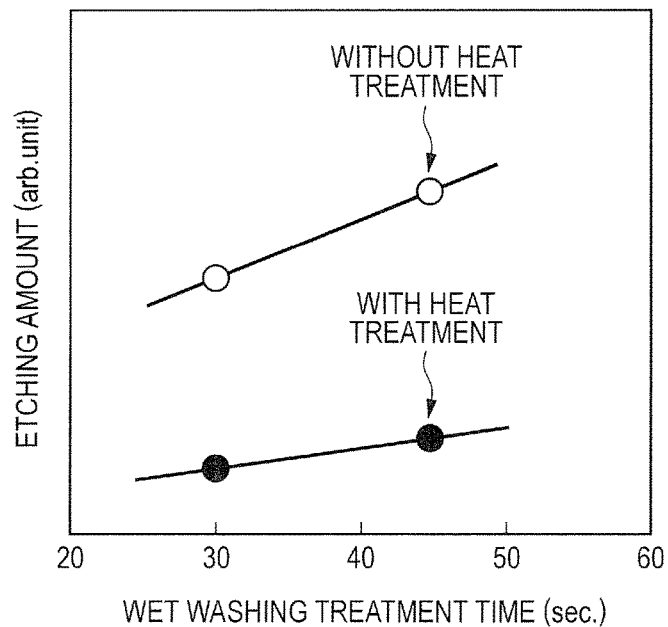
FIG. 38 is a graph showing comparison in etching amount of an insulating film in wet washing between an insulating film heat treated and an insulating film not heat treated, each after film formation.

The heat treatment of Step S13 can anneal the insulating film ZM2 and retard the etching rate of the insulating film ZM2 during wet washing of Step S17. FIG. 38 is a graph showing comparison in etching amount in wet washing (corresponding to the wet washing treatment of Step S17) between the insulating film (here, silicon oxide film) as the insulating film ZM2 subjected to heat treatment (corresponding to the heat treatment of Step S13) and not subjected to the heat treatment, each after film formation. The wet washing treatment time is plotted along the abscissa of the graph of FIG. 38, while the etching amount (etching thickness) in wet washing is plotted along the ordinate of the graph of FIG. 38 in arbitrary unit. As is apparent from the graph of FIG. 38, the heat treatment of the insulating film ZM2 after film formation can suppress an etching amount of the insulating film ZM2 in the wet washing treatment of Step S17.

If the etching amount of the insulating film ZM2 in the wet washing treatment of Step S17 can be suppressed, this means that a film having a decreased thickness can be formed in Step S12 as the insulating film ZM2, because in consideration of a decrease in the thickness of the silicide block film due to etching of the silicide block film in the wet washing treatment of Step S17, the silicide block film is formed, as a film having an adequate thickness, by stacking the insulating film ZM2 on the insulating film ZM1. Therefore, if the etching amount of the insulating film ZM2 in the wet washing treatment of Step S17 can be suppressed, the silicide block film can be left in layer form after completion of the wet washing treatment of Step S17 even if the insulating film ZM2 formed in Step S12 has a decreased thickness. The heat treatment of Step S13 after Step S12 (insulating film ZM2 formation step) enables suppression of the etching amount of the insulating film ZM2 in the wet washing treatment of Step S17 so that the insulating film ZM2 formed in Step S12 can have a decreased thickness.

A wall distance WD (refer to FIG. 10) corresponds to, between the gate electrodes GE adjacent to each other in a gate length direction, a distance between a sidewall spacer SW formed on the side wall of one of the gate electrodes and a sidewall spacer SW formed on the side wall of the other gate electrode. As semiconductor devices become smaller, MISFETs formed on the semiconductor substrate SB are miniaturized and the wall distance WD also becomes smaller. When the wall distance SD is small and the insulating film ZM2 is too thick, a region between the gate electrodes GE adjacent to each other in a gate length direction is filled with the insulating film ZM2. In this case, the insulating films ZM2 and ZM1 between the gate electrodes GE adjacent to each other in a gate length direction remain without being removed well during etching in Step S15, which may disturb formation of the metal silicide layer SL on the n$^+$ type semiconductor region SD. It is therefore desired to decrease the thickness of the insulating film ZM2 to some extent when the wall distance SD is small. For example, a total of the thickness (film thickness) T1 of the insulating film ZM1 formed in Step S10 and the thickness (film thickness) T2 of the insulating film ZM2 formed in Step S12 is preferably less than half of the wall distance SD (meaning (T1+T2)<WD×½). This makes it possible to effectively remove the insulating films ZM2 and ZM1 between the gate electrodes GE adjacent to each other in a gate length direction during the etching of Step S15 and effectively form the metal silicide layer SL on the n$^+$ type semiconductor region SD. The thickness T1 is shown in FIG. 12 and the thickness T2 is shown in FIG. 14.

By carrying out the heat treatment of Step S13 after Step S12 (insulating film ZM2 formation step), the etching amount of the insulating film ZM2 in the wet washing treatment of Step S17 can be suppressed. The insulating film ZM2 formed in Step S12 may have a decreased thickness. Such an insulating film can be used even if the wall distance WD decreases due to miniaturization of MISFETs or the like. As a result, the semiconductor device thus manufactured can have a smaller size.

The heat treatment temperature of Step S13 is lower than that of Step S11. For example, the heat treatment temperature of Step S11 is preferably from about 900 to 1050° C. and the heat treatment temperature of Step S13 is preferably from about 700 to 800° C. Since the heat treatment temperature of Step S13 is lower than that of Step S11, a shrinkage amount of the insulating films ZM1 and ZM2 during the heat treatment of Step S13 can be suppressed. This leads to suppression of a stress caused by shrinkage of the insulating films ZM1 and ZM2 during the heat treatment of Step S13. Generation of crystal defects in the semiconductor substrate SB which will otherwise occur due to a stress caused by the shrinkage of the insulating films ZM1 and ZM2 during the heat treatment of Step S13 can therefore be suppressed or prevented. In other words, the insulating film ZM2 has not yet been formed during the heat treatment of Step S11 so that in spite of a high heat treatment temperature, a stress due to shrinkage of the silicide block film is suppressed and thereby generation of crystal defects in the semiconductor substrate SB can be suppressed or prevented. During the heat treatment of Step S13, on the other hand, not only the insulating film ZM1 but also the insulating film ZM2 has been formed, but the heat treatment at a low temperature suppresses a stress due to the shrinkage of the silicide block film and thereby generation of crystal defects in the semiconductor substrate SB can be suppressed or prevented. In both the heat treatment of Step S11 and the heat treatment of Step S13, generation of crystal defects in the semiconductor substrate SB can be suppressed or prevented.

The heat treatment of Step S13 can be omitted. When the heat treatment of Step S13 is omitted, the minimum necessary thickness of the insulating film ZM2 becomes greater than that when the heat treatment of Step S13 is performed. Omission of the heat treatment of Step S13 however leads to a reduction in the number of steps, a reduction in the manufacturing time of the semiconductor device, and improvement in throughput of the semiconductor device. In addition, a manufacturing cost of the semiconductor device can be reduced.

Next, the thickness of each of the insulating film ZM1 and the insulating film ZM2 will be described further.

The technical concept of First Embodiment is that the silicide block film during the patterning of Steps S14 and S15 is made thick to some extent in consideration of a decrease in the thickness of the silicide block film during the wet washing treatment of Step S17 and at the same time, the silicide block film during the heat treatment of Step S11 is made thin in order to suppress a stress caused during the heat treatment of Step S11. It is therefore preferred to thin the insulating film ZM1 during the heat treatment of Step S11 while maintaining the thickness of the stacked film of the insulating film ZM1 and the insulating film ZM2 during the patterning of Steps S14 and S15.

The thickness T2 (refer to FIG. 14) of the insulating film ZM2 formed in Step S12 is preferably greater than the thickness T1 (refer to FIG. 12) of the insulating film ZM1 formed in Step S10 (meaning, T1<T2). In other words, the thickness T1 of the insulating film ZM1 formed in Step S10 is smaller than the thickness of the insulating film ZM2 formed in Step S12 (meaning, T1<T2).

By making the thickness T1 of the insulating film ZM1 formed in Step S10 smaller than the thickness T2 of the insulating film ZM2 formed in Step S12, the thickness of the insulating film ZM1 can be made smaller while maintaining the thickness of the stacked film of the insulating film ZM1 and the insulating film ZM2. A stress caused by shrinkage of the insulating film ZM1 during the heat treatment of Step S11 can therefore be made smaller. This makes it possible to more effectively suppress or prevent generation of crystal defects in the semiconductor substrate SB during the heat treatment of Step S11.

Described specifically, when the thickness T1 of the insulating film ZM1 formed in Step S10 is made smaller than the thickness T2 of the insulating film ZM2 formed in Step S12 (meaning T1<T2), the thickness of the silicide block film during the heat treatment of Step S11 can be made smaller than half of the thickness of the silicide block film during the patterning of Steps S14 and S15. This makes it possible to effectively suppress a stress caused by shrinkage of the silicide block film during the heat treatment of Step S11 and thereby more effectively suppress or prevent generation of crystal defects in the semiconductor substrate SB.

From the standpoint of suppressing a stress caused by shrinkage of the insulating film ZM1 during the heat treatment of Step S11, the thickness T1 of the insulating film ZM1 formed in Step S10 is preferably thin. An excessive decrease in the thickness T1 of the insulating film ZM1 however may cause a phenomenon that impurities introduced into the $n^+$ type semiconductor region SD and the like pass through the insulating film ZM1 and escape into the outside air. The thickness T1 of the insulating film ZM1 formed in Step S10 is preferably 10 nm or more (meaning, T1≥10 nm). Occurrence of the phenomenon that impurities introduced into the $n^+$ type semiconductor region SD and the like pass through the insulating film ZM1 and escape into the outside air during the heat treatment of Step S11 can be effectively prevented by adjusting the thickness T1 of the insulating film ZM1 formed in Step S10 to 10 nm or more (T1≥10 nm).

It is therefore preferred to adjust the thickness T1 of the insulating film to be formed in Step S10 to 10 nm or more and at the same time, make the thickness T2 of the insulating film ZM2 formed in Step S12 greater than the thickness T1 of the insulating film ZM1 formed in Step S10 (meaning, 10 nm≤T1<T2). This makes it possible to effectively prevent occurrence of the phenomenon that impurities introduced into the $n^+$ type semiconductor region SD and the like pass through the insulating film ZM1 and escape into the outside air during the heat treatment of Step S11 and at the same time to decrease a stress caused by shrinkage of the insulating film ZM1 during the heat treatment of Step S11 and thereby more effectively suppress or prevent generation of crystal defects in the semiconductor substrate SB.

In addition, it is preferred to decrease the thickness T1 of the insulating film ZM1 formed in Step S10 as much as possible in consideration of a stress at the time of the heat treatment of Step S11 if it is a thickness enough to prevent occurrence of the phenomenon that impurities introduced into the $n^+$ type semiconductor region SD and the like pass through the insulating film ZM1 and escape into the outside air during the heat treatment of Step S11. From this standpoint, the thickness T1 of the insulating film ZM1 formed in Step S10 is preferably 20 nm or less (T1≤20 nm). The thickness T1 of the insulating film ZM1 formed in Step S10 is most preferably within a range of from 10 to 20 nm (10 nm≤T1≤20 nm).

The insulating film ZM2 is formed so as to increase the thickness of the silicide block film to some extent during the patterning of Steps S14 and S15 in consideration of a decrease in the thickness of the silicide block film in the wet washing treatment of Step S17. The thickness T2 of the insulating film ZM2 formed in Step S12 can be set, depending on the thickness T1 of the insulating film ZM1 formed in Step S10 or the wet washing treatment conditions of Step S17. Although depending on the wet washing treatment conditions of Step S17, the thickness T1 of the insulating film ZM1 formed in Step S10 can be set at from about 10 to 20 nm and the thickness T2 of the insulating film ZM2 formed in Step S12 can be set at from about 20 to 30 nm.

In First Embodiment, the insulating film ZM1 functions as a silicide block film. The insulating film ZM2 also functions as a silicide block film. The insulating films ZM1 and ZM2 are formed so as to prevent formation of the metal silicide layer SL by the salicide process in a region not requiring the metal silicide layer SL.

The silicide block film after formation of the insulating film ZM1 in Step S10 but before formation of the insulating film ZM2 in Step S12 is made of the insulating film ZM1 and the silicide block film after formation of the insulating film ZM2 in Step S12 but just before the wet washing treatment of Step S17 is made of the stacked film of the insulating films ZM1 and ZM2. By wet washing treatment of Step S17, at least a portion of the insulating film ZM2 is etched. In other words, in the wet washing treatment of Step S17, a portion or the whole of the insulating film is etched. The silicide block film after wet washing treatment of Step S17 is therefore made of either the stacked film of the insulating film ZM1 and the insulating film ZM2 or a single-layer film (single film) of the insulating film ZM1.

When the entirety (whole thickness) of the insulating film ZM2 is etched in the wet washing treatment of Step S17, the silicide block film after wet washing treatment of Step S17 is made of a single layer film (single film) of the insulating film ZM1 (refer to FIG. 19). In this case, after wet washing treatment of Step S17, the insulating film ZM2 does not remain on the insulating film ZM1 and the upper surface of the insulating film ZM1 is exposed. In this case, in the wet washing treatment of Step S17, the insulating film ZM2 is etched to expose the upper surface of the insulating film ZM1 and then, a portion (a portion of the thickness) of the insulating film ZM1 may be etched. Also in such a case, the entirety (the whole thickness) of the insulating film ZM1 is not etched and the insulating film ZM1 remains in layer form in a region where the formation of the metal silicide layer SL should be prevented.

Figure 39:
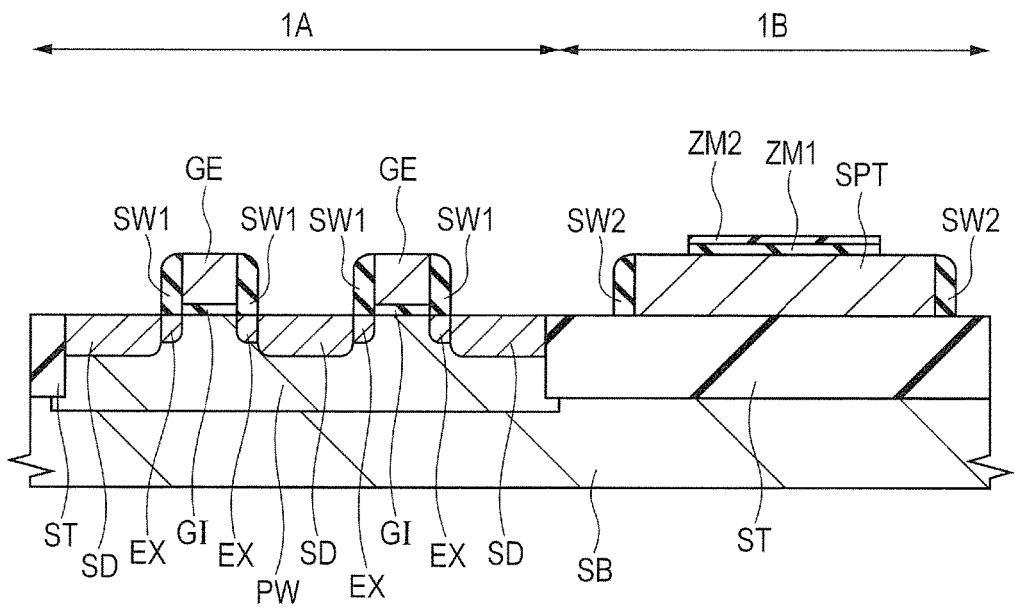
FIG. 39 is a fragmentary cross-sectional view of the semiconductor device same as that of FIG. 19 during a manufacturing step thereof.

On the other hand, when not the entirety (whole thickness) but a portion (a portion of the thickness) of the insulating film ZM2 is etched in the wet washing treatment of Step S17, the silicide block film after the wet washing treatment of Step S17 is made of a stacked film of the insulating film ZM1 and the insulating film ZM2 that has remained in layer form on the insulating film ZM1 (refer to FIG. 39). In this case, the insulating film ZM2 remains in layer form on the insulating film ZM1 after the wet washing treatment of Step S17, but the thickness of the insulating film ZM2 after the wet washing treatment of Step S17 becomes smaller than that of the insulating film ZM2 before the wet washing treatment of Step S17.

FIG. 19 shows the upper surface of the insulating film ZM1 exposed by etching the entirety (whole thickness) of the insulating film ZM2 in the wet washing treatment of Step S17. FIG. 39 is a fragmentary cross-sectional view of the semiconductor device of First Embodiment during a manufacturing step thereof and shows a step stage similar to that of FIG. 19. FIG. 39 however shows the insulating film ZM2 left in layer form on the insulating film ZM1 after etching of a portion (portion of the thickness) the insulating film ZM2 in the wet washing treatment of Step S17.

In either the case of FIG. 19 or the case of FIG. 39, the thickness of the silicide block film decreases after the wet washing treatment of Step S17. The thickness of the silicide block film after the wet washing treatment of Step S17 becomes smaller than that of the silicide block film before the wet washing treatment of Step S17. In either the case of FIG. 19 or the case of FIG. 39, however, in consideration of the wet washing treatment of Step S17, the thickness T1 of the insulating film ZM1 to be formed in Step S10 and the thickness T2 of the insulating film ZM2 to be formed in Step S12 are set so as to leave, after the wet washing treatment of Step S17 is finished, the silicide block film in layer form in the region where formation of the metal silicide layer SL should be prevented. After the wet washing treatment of Step S17 is finished, the thickness of the silicide block film remaining in layer form in the region where the formation of the metal silicide layer SL should be prevented is desirably 10 nm or more. This means that in FIG. 19, after the wet washing treatment of Step S17 is finished, the thickness of the insulating film ZM1 remaining on the silicon pattern SPT is desirably 10 nm or more. In FIG. 39, after the wet washing treatment of Step S17 is finished, the thickness of the stacked film of the insulating film ZM1 and the insulating film ZM2 that has remained on the silicon pattern SPT (meaning, a total thickness of the insulating film ZM1 and the insulating film ZM2) is desirably 10 nm or more.

When the metal film ME is formed by sputtering in Step S18 and the silicide block film remaining in layer form in the region where the formation of the metal silicide layer SL should be prevented is too thin, sputtering particles that come flying may shave this silicide block film to expose the underlying film (a portion of the silicon pattern SPT on which the metal silicide layer SL should not be formed) in the metal film ME formation step. If the thickness of the silicide block film remaining in layer form, after completion of the wet washing treatment of Step S17, in the region where the formation of the metal silicide layer SL should be prevented is set at 10 nm or more, the phenomenon that sputtering particles that come flying shave the silicide block film to expose an underlying layer can be prevented effectively even if the metal film ME is formed by sputtering in Step S18. As a result, inevitable formation of the metal silicide layer SL in the region where the formation of the metal silicide layer SL should be prevented can be prevented effectively.

Next, the material or formation method of the insulating films ZM1 and ZM2 will be described further.

A silicon oxide film formed by thermal CVD using, as a reaction gas, an ozone ($O_3$) gas or TEOS (tetraethoxysilane) gas or a silicon oxide film formed by thermal CVD using, as a reaction gas, an oxygen ($O_2$) gas or silane gas is formed on the surface of the substrate by reacting with a gas at a relatively low temperature. Such a silicon oxide film is likely to cause the problem as described in Second Investigation Example, because a shrinkage amount during the high-temperature heat treatment such as activation annealing is very large. First Embodiment is therefore very effective when applied to the silicon oxide film formed by thermal CVD using an ozone gas or TEOS gas as a reaction gas or the silicon oxide film formed by thermal CVD using an oxygen gas or silane as a reaction gas.

When the substrate temperature during the formation of the insulating film by thermal CVD is low, the problem as described in Second Investigation Example is likely to occur because the shrinkage amount of the insulating film during the high-temperature heat treatment such as activation annealing is very large. First Embodiment is therefore very effective when applied to the case where the insulating film ZM1 is formed by thermal CVD and the substrate temperature (temperature of the semiconductor substrate SB) at the time of forming the film is low (more specifically, the substrate temperature is 500° C. or less).

Compared with an insulating film formed by CVD, an insulating film formed by plasma CVD contains a smaller amount of impurities and has a relatively small shrinkage amount when subjected to the high-temperature heat treatment such as activation annealing. Film formation by plasma CVD however may damage the underlying film. As the method of forming the insulating film ZM1, thermal CVD is preferred. By using it, damage to the underlying film during formation of the insulating film ZM1 can be suppressed or prevented and the semiconductor device thus manufactured can have more improved reliability.

In addition, since the shrinkage amount of the silicide block film during the high-temperature heat treatment such as activation annealing is very large when not plasma CVD but thermal CVD is used for the formation of the silicide block film, the problem as described in Second Investigation Example is likely to occur. In First Embodiment, however, the problem described above in Second Investigation Example can be overcome so that thermal CVD can be preferably used as the method of forming the insulating film ZM1.

For achieving stable characteristics, it is desired not to carry out treatment at a considerably high temperature after formation of the source/drain region ($n^+$ type semiconductor region SD) by ion implantation and before activation annealing (the heat treatment of Step S11). As a method of forming the insulating film ZM1, therefore, low-temperature thermal CVD (specifically, at a substrate temperature of 500° C. or less) is preferred. When the silicide block film is formed by low-temperature thermal CVD, a shrinkage amount of the silicide block film during the high-temperature heat treatment such as activation annealing is likely to increase and the problem as described in Second Investigation Example occurs easily. In First Embodiment, however, the problem as described in Second Investigation Example can be overcome so that low-temperature thermal CVD can preferably be used as the method of forming the insulating film ZM1.

In First Embodiment, a single-layer thick insulating film is not used as the silicide block film, but the thick insulating film is divided into two insulating films (ZM1 and ZM2) and the heat treatment of Step S11 is performed between the step (Step S10) of forming the first-layer insulating film (ZM1) and the step (Step S12) of forming the second-layer insulating film (ZM2). In First Embodiment, the insulating film ZM1 and the insulating film ZM2 are made of the same material. This means that the insulating film ZM1 and the insulating film ZM2 have the same material. In this case, when the insulating film ZM1 is made of a silicon oxide film, the insulating film ZM2 is also made of a silicon oxide film. In another mode, the insulating film ZM1 and the insulating film ZM2 may be made of respectively different materials. In this case, the insulating film ZM1 and the insulating film ZM2 have respectively different materials. For example, the insulating film ZM1 is made of a silicon oxide film and the insulating film ZM2 is made of a silicon nitride film.

If the insulating film ZM1 and the insulating film ZM2 are made of the same material as in First Embodiment, a material suited as a silicide block film can be used for both the insulating film ZM1 and the insulating film ZM2. This makes it possible to easily and effectively set a region where the metal silicide layer SL is formed and a region where it is not formed by using the silicide block film. Further, formation of the insulating film ZM1 and the insulating film ZM2 from the same material facilitates the insulating film ZM1 formation step and the insulating film ZM2 formation step. For example, the insulating film ZM1 and the insulating film ZM2 can be formed using the same film forming apparatus. This facilitates manufacture of the semiconductor device and in addition, contributes to a reduction in the manufacturing cost of the semiconductor device.

When the insulating film ZM1 and the insulating film ZM2 are made of respectively different materials, on the other hand, the etching rate of the insulating film ZM1 and the etching rate of the insulating film ZM2, each with a chemical solution used in the wet washing treatment of Step S17 can be differentiated. Since the material of the insulating film ZM2 can be selected so as to make the etching rate of the insulating film ZM2 with the chemical solution used in the wet washing treatment of Step S17 smaller than that of the insulating film ZM1 with the chemical solution used in the wet washing treatment of Step S17, the etching amount of the insulating film ZM2 in the wet washing treatment of Step S17 can be suppressed. This makes it possible to thin the insulating film ZM2 formed in Step S12 and therefore cope with a reduction in the wall distance SD caused by miniaturization of MISFETs or the like. Thus, it is advantageous for size reduction of the semiconductor device.

In First Embodiment, as an element having a region where the formation of the metal silicide layer SL should be prevented by the silicide block film (here, the insulating film ZM1), a resistive element (polysilicon resistive element) formed from the silicon pattern SPT is exemplified, but an element other than the resistive element formed from the silicon pattern SPT may be used. For example, a resistive element formed by introducing an impurity into the semiconductor substrate SB by ion implantation can also be used. In this case, it is possible to form, in a region of an impurity diffusion layer configuring the resistive element to be coupled to the plug PG, the metal silicide layer SL as on the source/drain region and not to form the metal silicide layer SL in the other region by leaving the insulating films ZM1 and ZM2 in the etching step of Step S15.

In First Embodiment, the metal silicide layer SL formed on the source/drain region ($n^+$ type semiconductor region SD) and on the gate electrode GE in the MISFET formation region 1A has been described. There may be another embodiment in which the metal silicide layer SL is formed on the source/drain region ($n^+$ type semiconductor region SD) in the MISFET formation region 1A, but the metal silicide layer SL is not formed on a portion or the whole of the gate electrode GE. For example, when the gate electrode GE is made of a metal film, the metal silicide layer SL is not formed on the gate electrode GE. Even when the gate electrode GE is made of a silicon film, it is also possible to prevent formation of the metal silicide layer SL on a portion or the whole of the gate electrode GE by leaving the insulating films ZM1 and ZM2 on a portion of the gate electrode GE on which the metal silicide layer SL is not formed in the etching step of Step S15. In this case, the metal silicide layer SL is not formed on a portion of the gate electrode GE covered with the insulating film ZM1 in the salicide process.

It is also possible to have, on the same semiconductor substrate SB, both a MISFET with a source/drain region having on the upper surface thereof the metal silicide layer SL and a MISFET with a source/drain region having on the upper surface thereof no metal silicide layer SL. In this case, it is only required that the insulating films ZM1 and ZM2 on the source/drain region on which the metal silicide layer SL is to be formed is removed by the etching of Step S15 and the insulating films ZM1 and ZM2 on the source/drain region on which the metal silicide layer SL is not to be formed is left without being removed by the etching of Step S15. In this case, in the salicide process, the metal silicide layer SL is not formed on the source/drain region covered with the insulating film ZM1 and the metal silicide layer SL is formed on the source/drain region not covered with the insulating film ZM1.

The invention made by the present inventors has been described based on the embodiment thereof. It is needless to say that the present invention is not limited to or by the embodiment but can be changed in various ways without departing from the gist of the invention.

What is claimed is:

1. A method of manufacturing a semiconductor device, comprising the steps of:
    (a) providing a semiconductor substrate;
    (b) after the step (a), forming a gate electrode for MISFET over the semiconductor substrate via a gate insulating film;
    (c) after the step (b), forming a sidewall insulating film over a side wall of the gate electrode;
    (d) after the step (c), forming a source/drain region for MISFET in the semiconductor substrate by ion implantation;
    (e) after the step (d), forming a first insulating film over the semiconductor substrate so as to cover the gate electrode and the sidewall insulating film;
    (f) after the step (e), carrying out first heat treatment at a first heat treatment temperature;
    (g) after the step (f), forming a second insulating film over the first insulating film;
    (h) after the step (g), forming a resist pattern over the second insulating film;
    (i) after the step (h), etching the second insulating film and the first insulating film while using the resist pattern as an etching mask, and thereby removing a portion of the second insulating film and the first insulating film not covered with the resist pattern and leaving the second insulating film and the first insulating film below the resist pattern;
    (j) after the step (i), removing the resist pattern;
    (k) after the step (j), carrying out wet washing treatment;
    (l) after the step (k), forming a metal film over the semiconductor substrate including the source/drain region so as to cover the gate electrode and the sidewall insulating film; and
    (m) after the step (l), carrying out second heat treatment to cause a reaction between the metal film and the source/drain region to form a metal silicide layer over the source/drain region.

2. The method of manufacturing a semiconductor device according to claim 1,
    wherein in the step (h), the resist pattern is not formed above the source/drain region, and
    wherein in the step (i), the second insulating film and the first insulating film over the source/drain region are removed.

3. The method of manufacturing a semiconductor device according to claim 1,
    wherein after the step (d) but before the step (e), the heat treatment at a temperature not less than the first heat treatment temperature is not performed.

4. The method of manufacturing a semiconductor device according to claim 3, wherein after the step (g) but before the step (i), the heat treatment at a temperature not less than the first heat treatment temperature is not performed.

5. The method of manufacturing a semiconductor device according to claim 4, further comprising the step of:
(g1) after the step (g) but before the step (h), carrying out third treatment at a second heat treatment temperature lower than the first heat treatment temperature.

6. The method of manufacturing a semiconductor device according to claim 1,
wherein an impurity in the source/drain region is activated by the first heat treatment.

7. The method of manufacturing a semiconductor device according to claim 1,
wherein the first heat treatment temperature is 900° C. or more.

8. The method of manufacturing a semiconductor device according to claim 1,
wherein a second thickness of the second insulating film formed in the step (g) is greater than a first thickness of the first insulating film formed in the step (e).

9. The method of manufacturing a semiconductor device according to claim 8,
wherein the first thickness is 10 nm or more.

10. The method of manufacturing a semiconductor device according to claim 9,
wherein the first thickness is 20 nm or less.

11. The method of manufacturing a semiconductor device according to claim 1, further comprising the step of:
(n) after the step (m), removing a portion of the metal film which has not reacted in the step (m).

12. The method of manufacturing a semiconductor device according to claim 1,
wherein the first insulating film functions as a silicide block film for preventing formation of the metal silicide layer.

13. The method of manufacturing a semiconductor device according to claim 1,
wherein in the step (k), at least a portion of the second insulating film is etched by the wet washing treatment.

14. The method of manufacturing a semiconductor device according to claim 1,
wherein the first insulating film and the second insulating film have the same material.

15. The method of manufacturing a semiconductor device according to claim 1,
wherein the first insulating film and the second insulating film have respectively different materials.

16. The method of manufacturing a semiconductor device according to claim 1,
wherein in the step (i), the second insulating film and the first insulating film over the source/drain region and the gate electrode are removed, and
wherein in the step (m), the metal film and the source/drain region or the gate electrode react with each other by the second heat treatment to form the metal silicide layer over each of the source/drain region and the gate electrode.

17. The method of manufacturing a semiconductor device according to claim 1,
wherein in the step (b), the gate electrode and a conductor pattern for resistive element are formed over the semiconductor substrate,
wherein in the step (e), the first insulating film is formed over the semiconductor substrate so as to cover the conductor pattern, the gate electrode, and the sidewall insulating film,
wherein in the step (h), the resist pattern is formed above a portion of the conductor pattern, and
wherein in the step (k), the metal film is formed over the semiconductor substrate including the source/drain region to cover the conductor pattern, the gate electrode, and the sidewall insulating film.

18. The method of manufacturing a semiconductor device according to claim 17,
wherein in the step (i), the second insulating film and the first insulating film over the source/drain region, the gate electrode, and a portion of the conductor pattern are removed, and
wherein in the step (m), the metal film reacts with the source/drain region, the gate electrode, and the conductor pattern by the second heat treatment to form the metal silicide layer over each of the source/drain region, the gate electrode, and the portion of the conductor pattern.

19. A method of manufacturing a semiconductor device, comprising the steps of:
(a) providing a semiconductor substrate;
(b) after the step (a), forming a gate electrode for MISFET over the semiconductor substrate via a gate insulating film;
(c) after the step (b), forming a sidewall insulating film over a side wall of the gate electrode;
(d) after the step (c), forming a source/drain region for the MISFET in the semiconductor substrate by ion implantation;
(e) after the step (d), forming a first insulating film over the semiconductor substrate so as to cover the gate electrode and the sidewall insulating film;
(f) after the step (e), carrying out first heat treatment at a first heat treatment temperature;
(g) after the step (f), forming a second insulating film over the first insulating film;
(h) after the step (g), forming a resist pattern over the second insulating film;
(i) after the step (h), etching the second insulating film and the first insulating film while using the resist pattern as an etching mask, and thereby removing a portion of the second insulating film and the first insulating film not covered with the resist pattern and leaving the second insulating film and the first insulating film below the resist pattern;
(j) after the step (i), removing the resist pattern;
(k) after the step (j), carrying out wet washing treatment;
(l) after the step (k), forming a metal film over the semiconductor substrate including the source/drain region so as to cover the gate electrode and the sidewall insulating film; and
(m) after the step (l), carrying out second heat treatment to cause a reaction between the metal film and the source/drain region to form a metal silicide layer over the source/drain region,
wherein after the step (d) but before the step (e), heat treatment at a temperature not less than the first heat treatment temperature is not performed;
wherein in the step (f), an impurity in the source/drain region is activated by the first heat treatment,
wherein after the step (g) but before the step (i), heat treatment at a temperature not less than the first heat treatment temperature is not performed,
wherein in the step (h), the resist pattern is not formed above the source/drain region, and wherein in the step (i), the second insulating film and the first insulating film over the source/drain region are removed.

\* \* \* \* \*